(12) United States Patent
Bong et al.

(10) Patent No.: US 12,336,430 B2
(45) Date of Patent: Jun. 17, 2025

(54) THERMOELECTRIC MODULE AND POWER GENERATION APPARATUS INCLUDING THE SAME

(71) Applicant: LG INNOTEK CO., LTD., Seoul (KR)

(72) Inventors: Sang Hoon Bong, Seoul (KR); Un Hak Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 279 days.

(21) Appl. No.: 18/010,678

(22) PCT Filed: Jun. 15, 2021

(86) PCT No.: PCT/KR2021/007426
§ 371 (c)(1),
(2) Date: Dec. 15, 2022

(87) PCT Pub. No.: WO2021/256810
PCT Pub. Date: Dec. 23, 2021

(65) Prior Publication Data
US 2023/0232718 A1 Jul. 20, 2023

(30) Foreign Application Priority Data

Jun. 15, 2020 (KR) .......................... 10-2020-0072192
Jun. 18, 2020 (KR) .......................... 10-2020-0074230

(51) Int. Cl.
*H10N 10/17* (2023.01)
(52) U.S. Cl.
CPC ................................. *H10N 10/17* (2023.02)
(58) Field of Classification Search
CPC ............................... H10N 10/13; H10N 10/17
See application file for complete search history.

(56) References Cited

U.S. PATENT DOCUMENTS 4,520,305 A * 5/1985 Cauchy ............... F28D 15/0275
310/306
6,345,507 B1 2/2002 Gillen
(Continued)

FOREIGN PATENT DOCUMENTS

JP         6-21252 Y2      6/1994
JP      2000-252531 A      9/2000
(Continued)

OTHER PUBLICATIONS

Extended European Search Report for European Application No. 21824783.1, dated May 24, 2024.

*Primary Examiner* — Lindsey A Buck
(74) *Attorney, Agent, or Firm* — Birch, Stewart, Kolasch & Birch, LLP

(57) ABSTRACT

A thermoelectric module, according to an embodiment of the present invention, comprises: a substrate; a thermoelectric element arranged on the substrate to be spaced apart from each other; and a cover member arranged on the substrate and arranged on one side of the thermoelectric element, wherein the cover member includes a first side surface closest to one side of the thermoelectric element and a second side surface facing the first side surface, the first side surface includes a first groove concave toward the second side surface, the second side surface includes a second groove concave toward the first side surface, and the width of the first groove is greater than the width of the second groove.

17 Claims, 26 Drawing Sheets

(56) References Cited

U.S. PATENT DOCUMENTS

| | | |
|---|---|---|
| 2015/0116943 A1 | 4/2015 | Olsson et al. |
| 2015/0280097 A1* | 10/2015 | Jinushi .................. H10N 10/17 136/205 |
| 2018/0083179 A1 | 3/2018 | Yoshida et al. |

FOREIGN PATENT DOCUMENTS

| | | |
|---|---|---|
| JP | 2007-221895 A | 8/2007 |
| KR | 10-2016-0077078 A | 7/2016 |
| KR | 10-2019-0065763 A | 6/2019 |
| KR | 10-2083611 B1 | 3/2020 |

* cited by examiner

[FIG. 1]
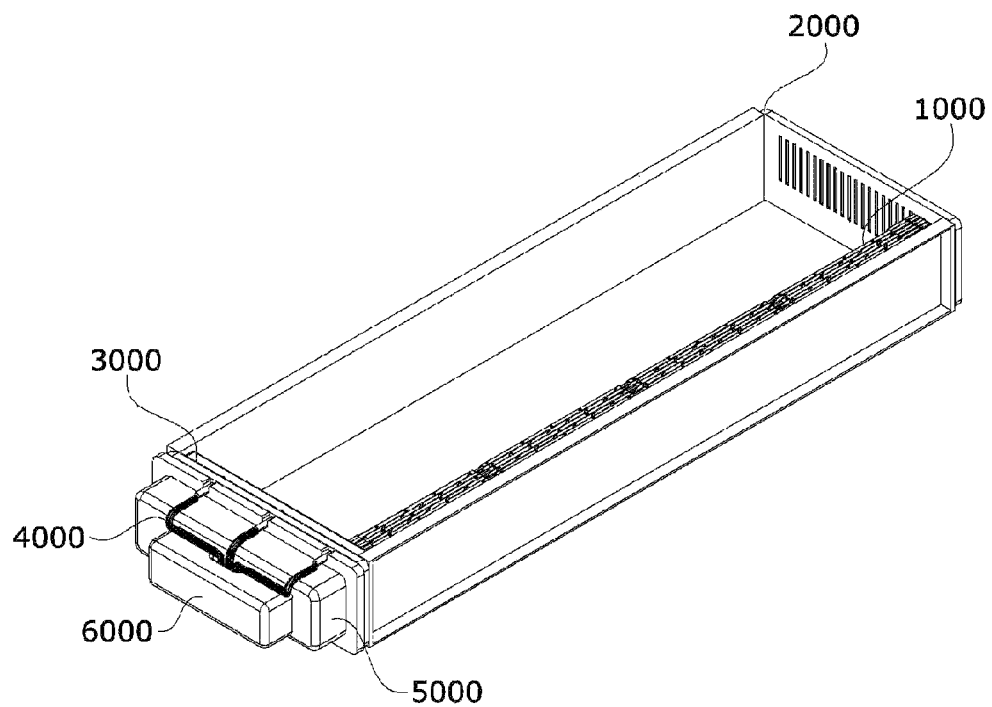

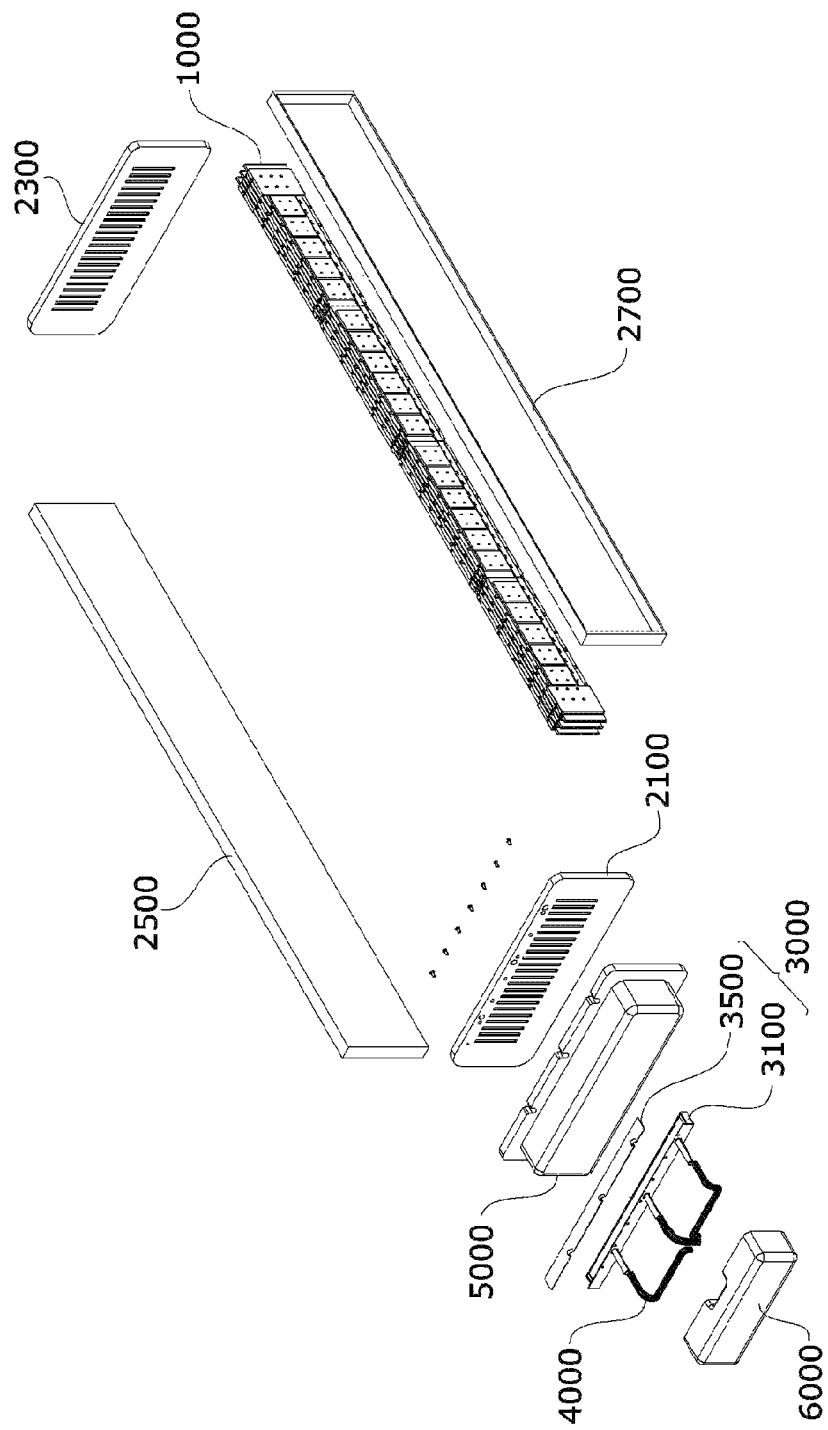
[FIG. 2]

[FIG. 3]
1000
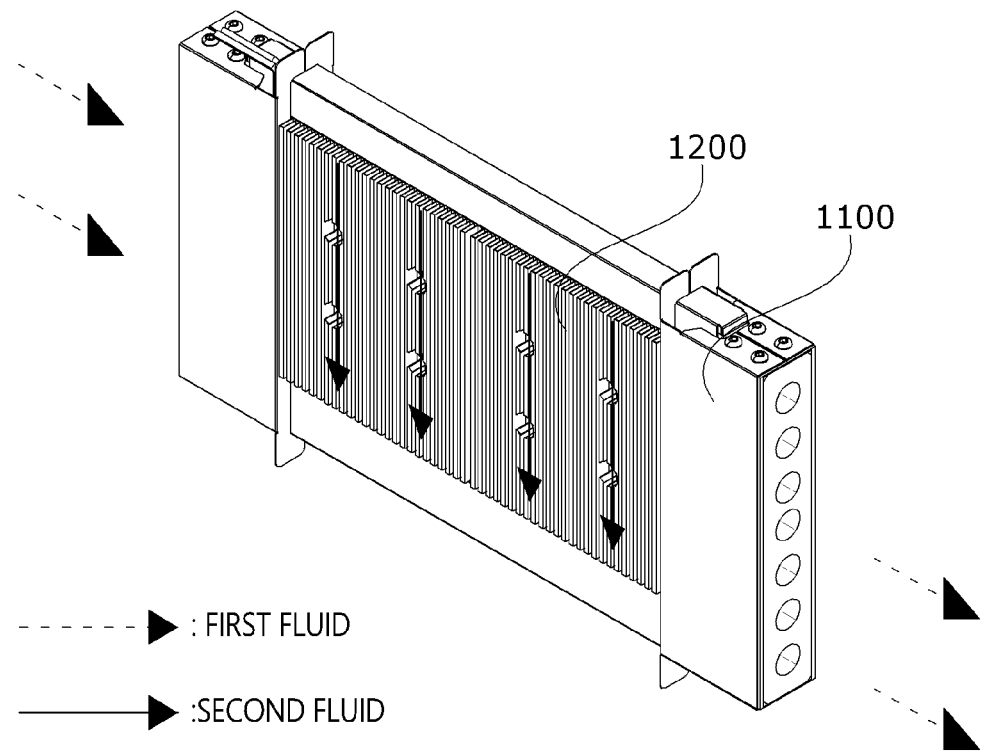

[FIG. 4]
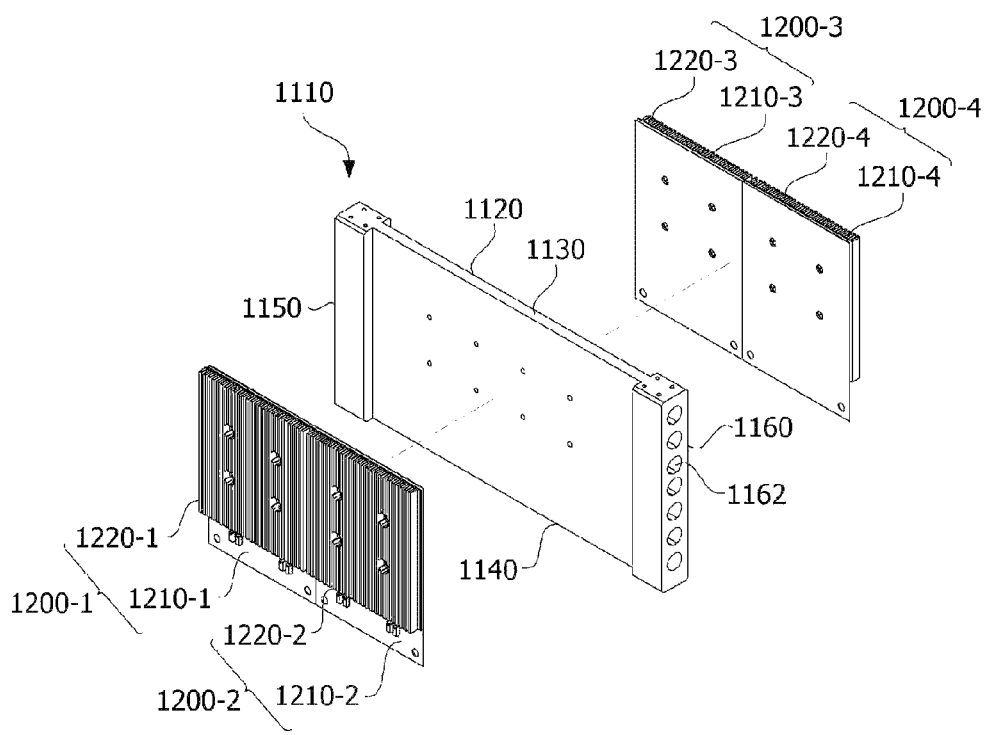
1200: 1200-1, 1200-2, 1200-3, 1200-4
1210: 1210-1, 1210-2, 1210-3, 1210-4
1220: 1220-1, 1220-2, 1220-3, 1220-4

[FIG. 5]
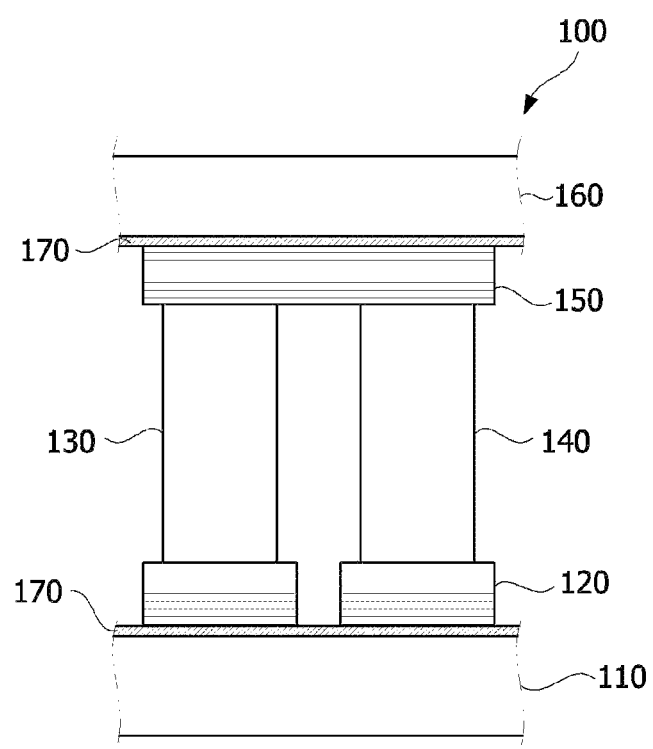

[FIG. 6]
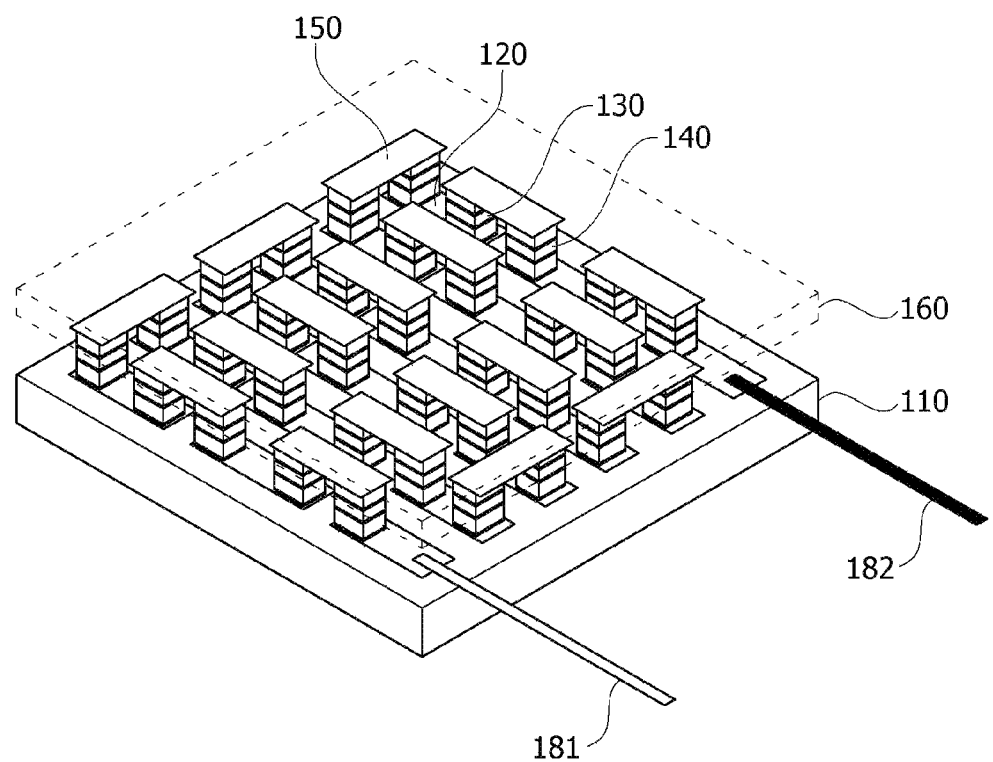
[FIG. 7]
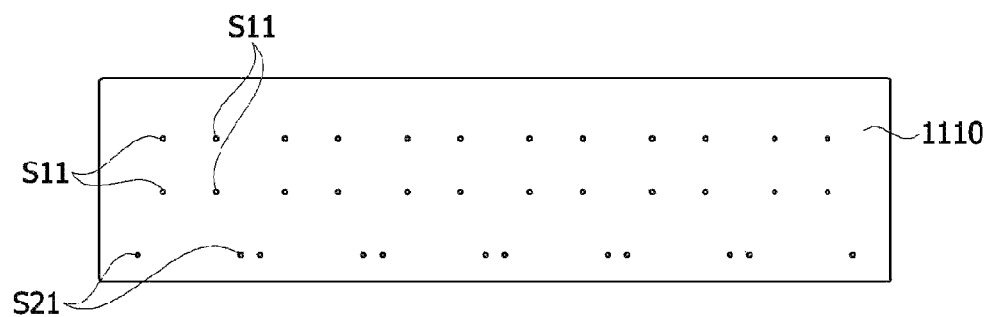

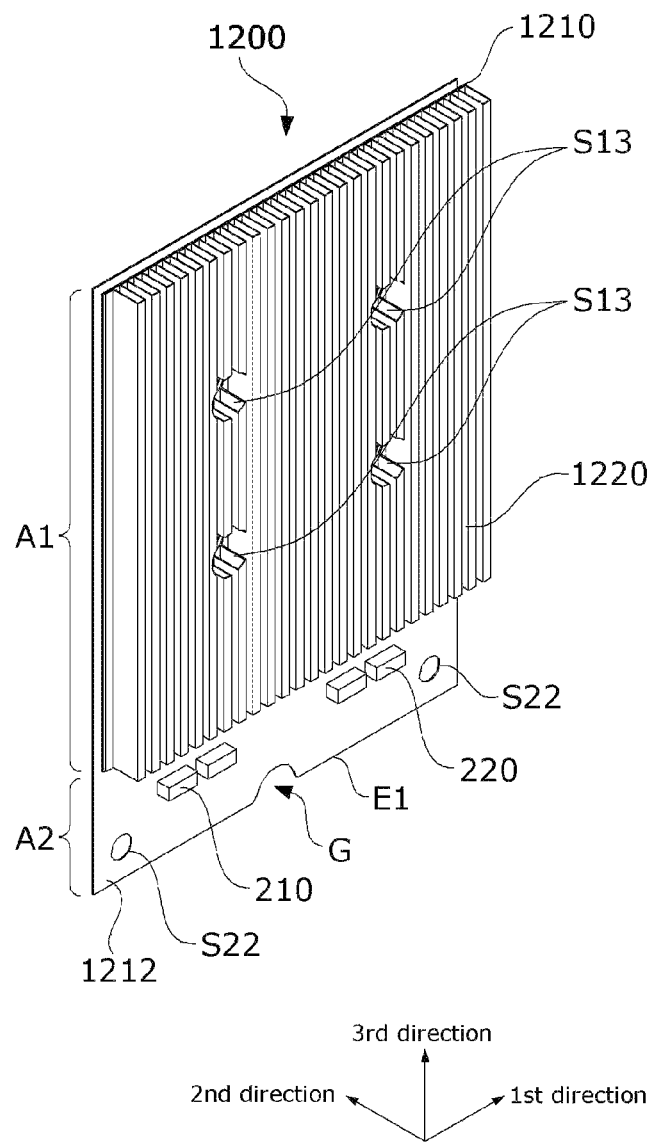
[FIG. 8]

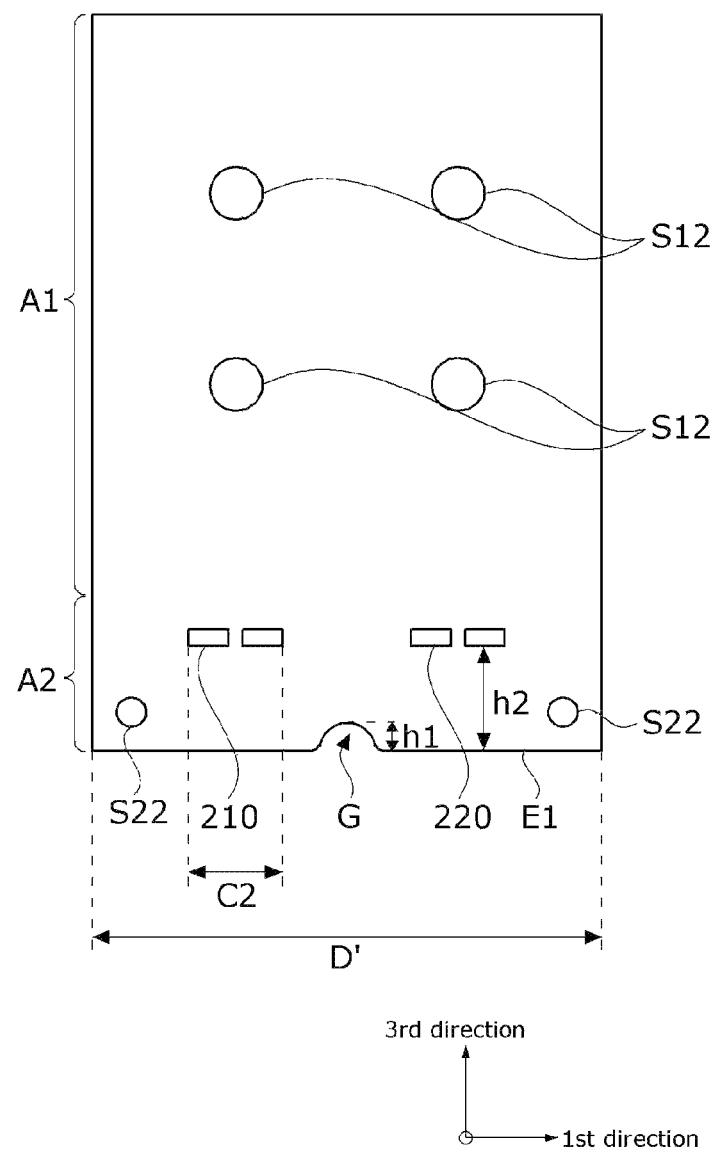
[FIG. 9]

[FIG. 10]
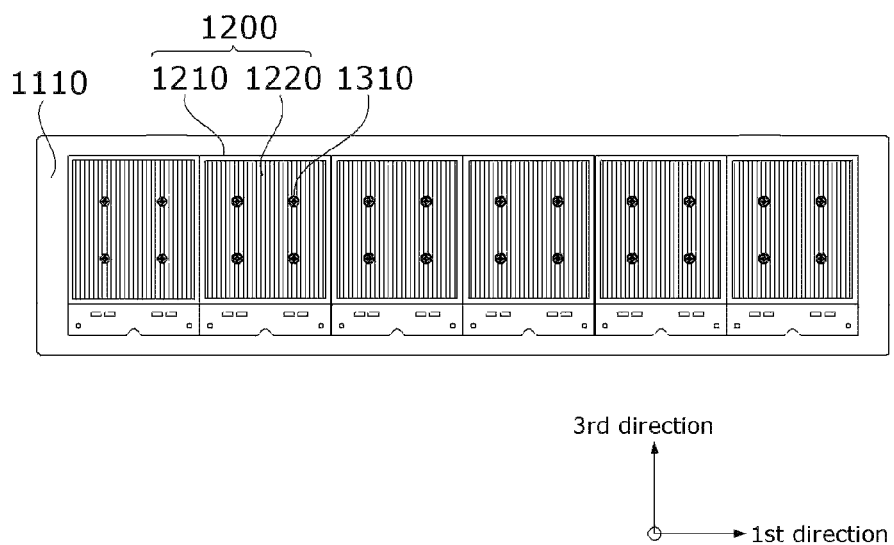

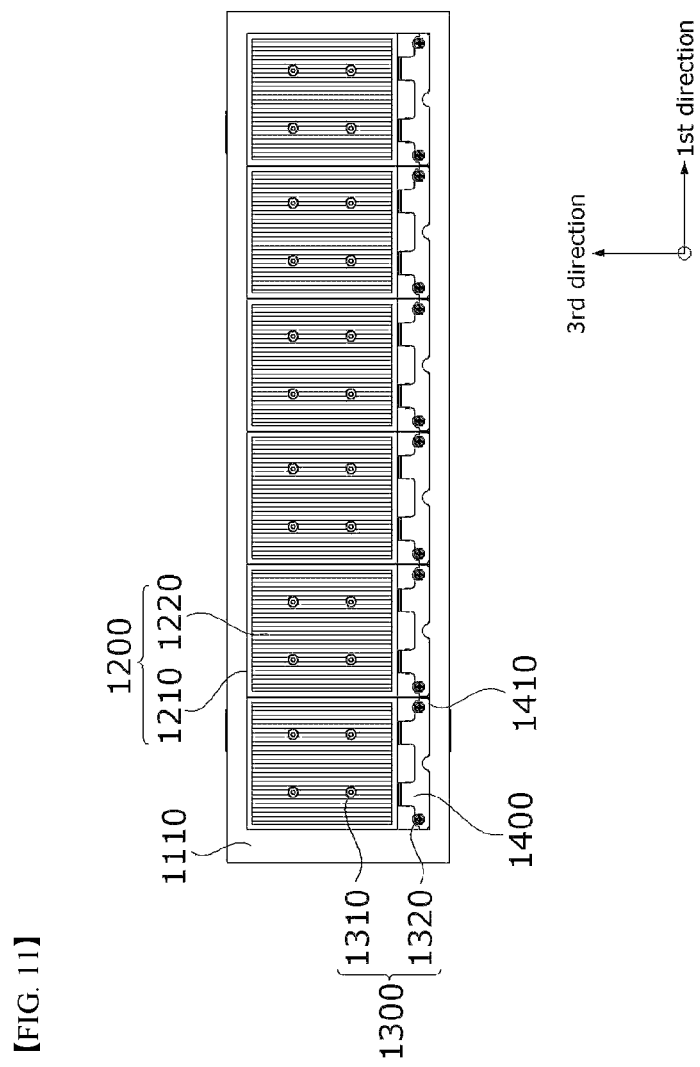
[FIG. 11]

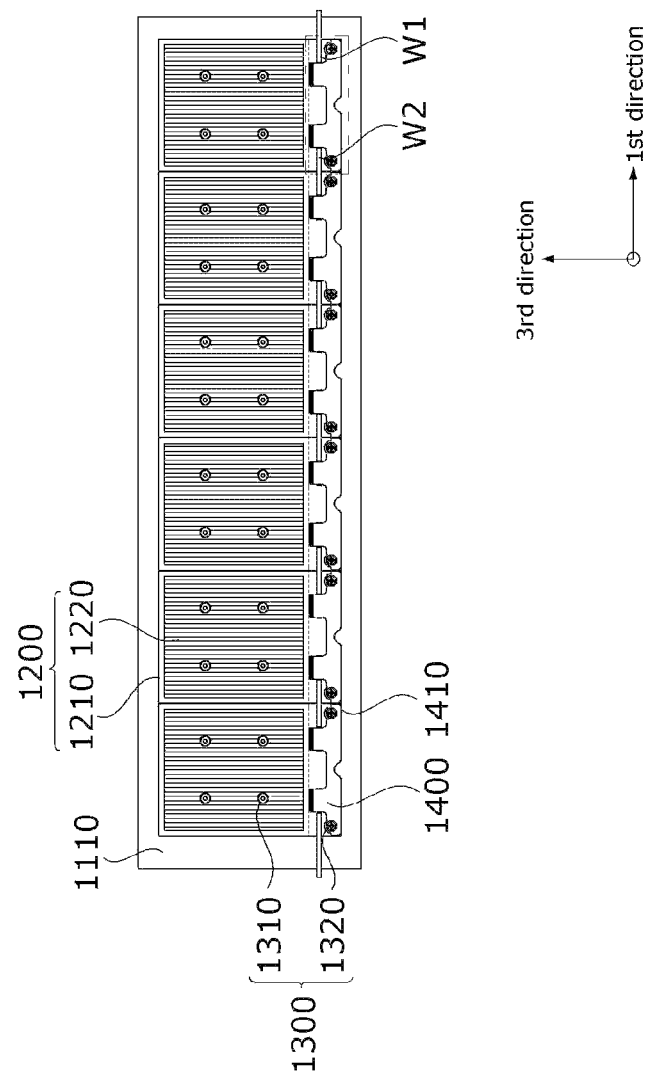
[FIG. 12]

[FIG. 13]
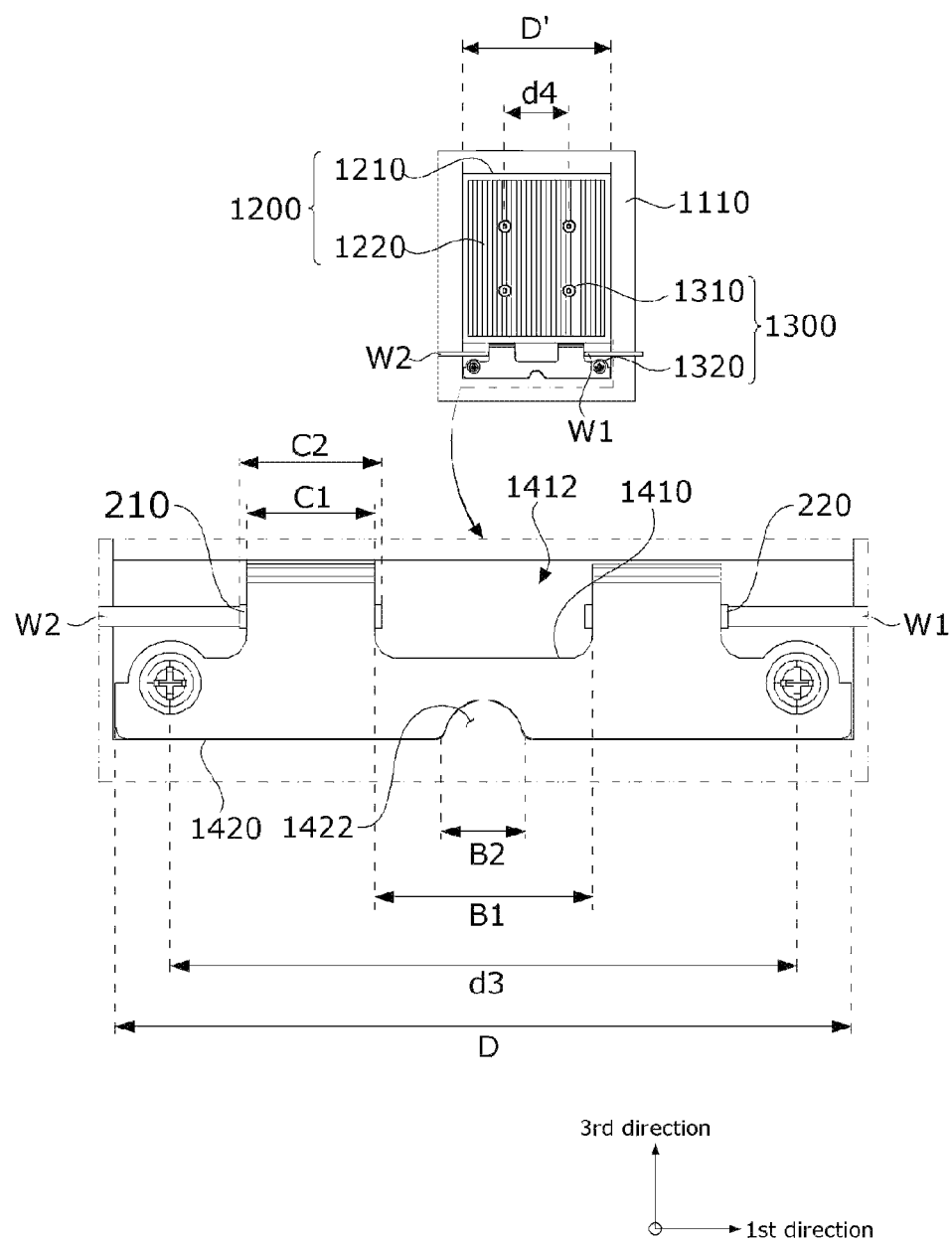

[FIG. 14a]
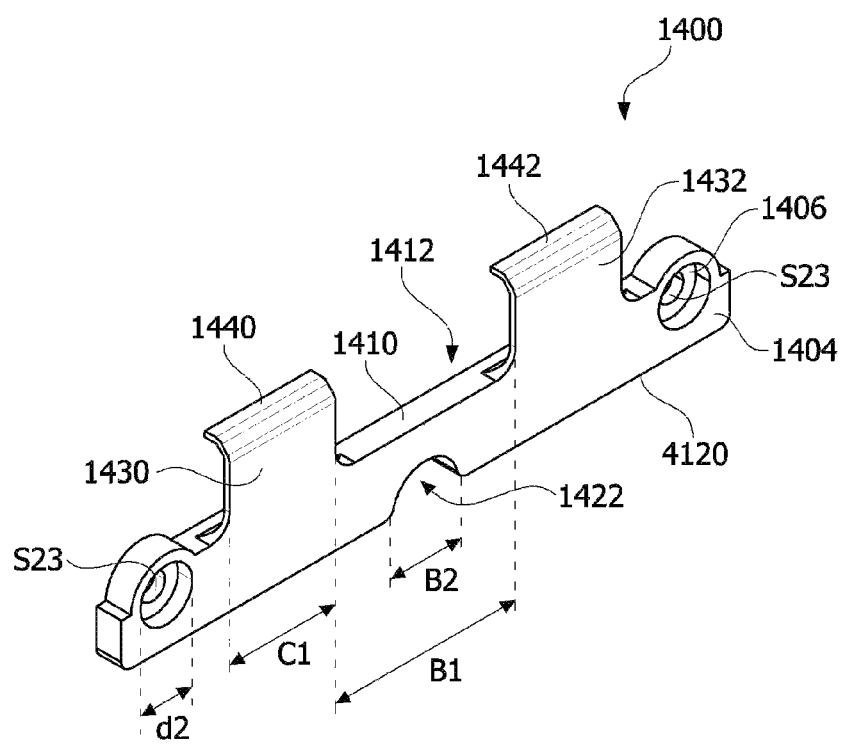

[FIG. 14b]
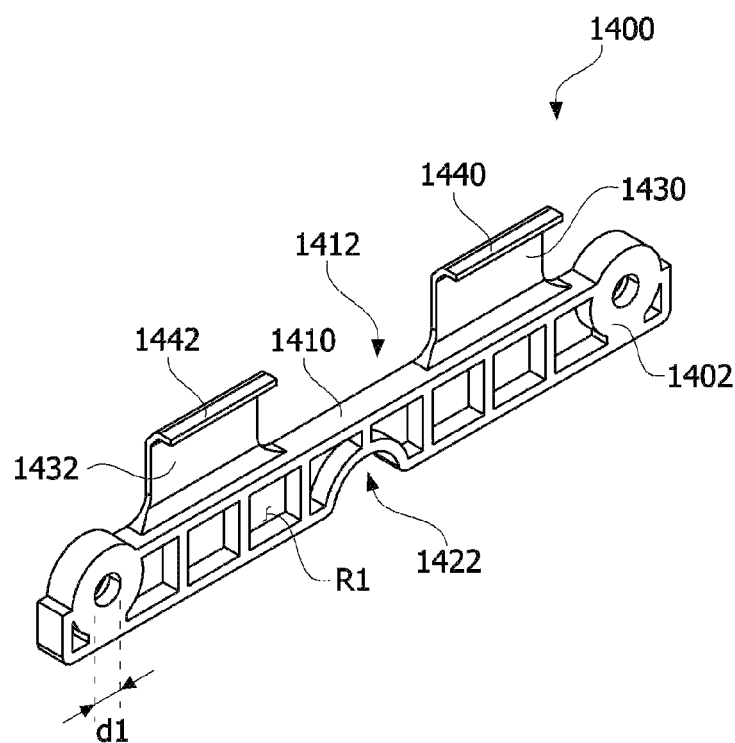

[FIG. 15]
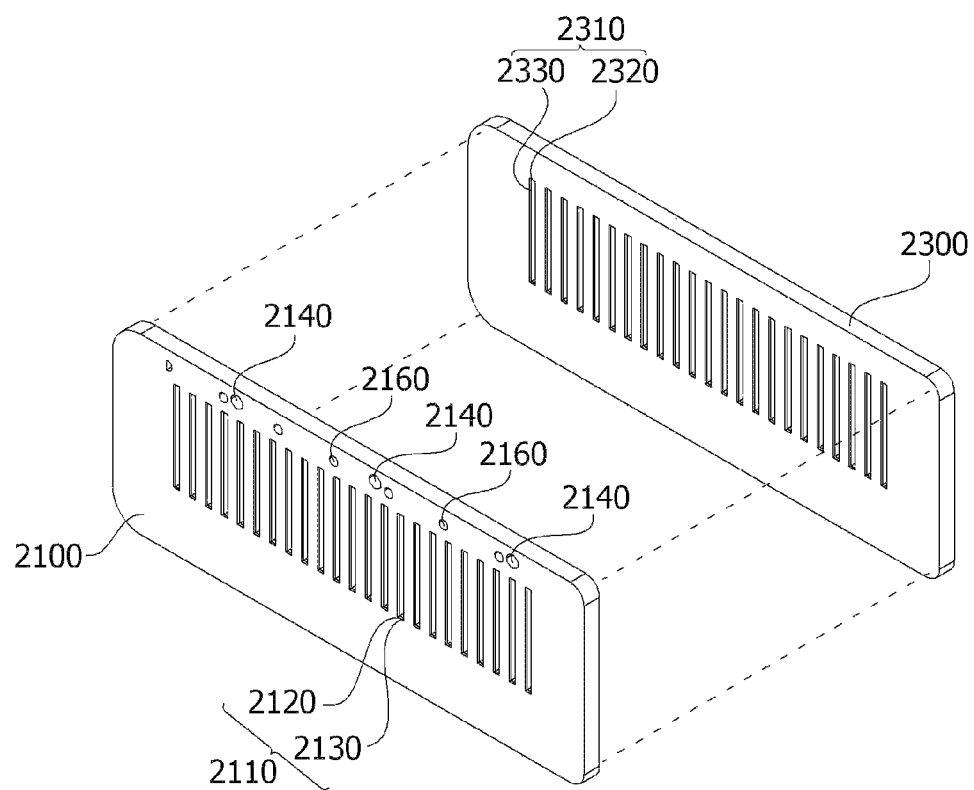

[FIG. 16]
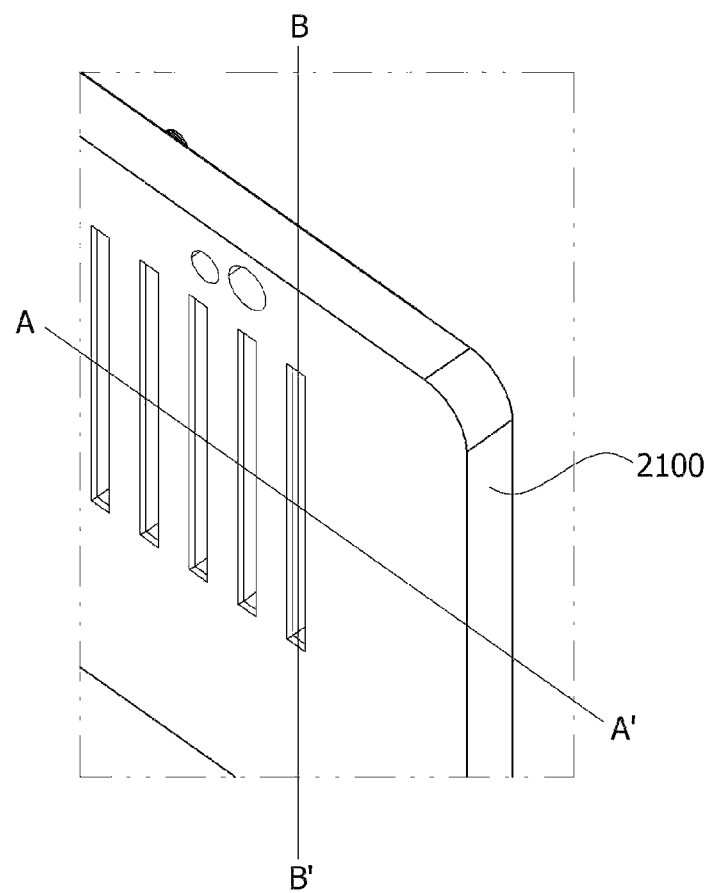

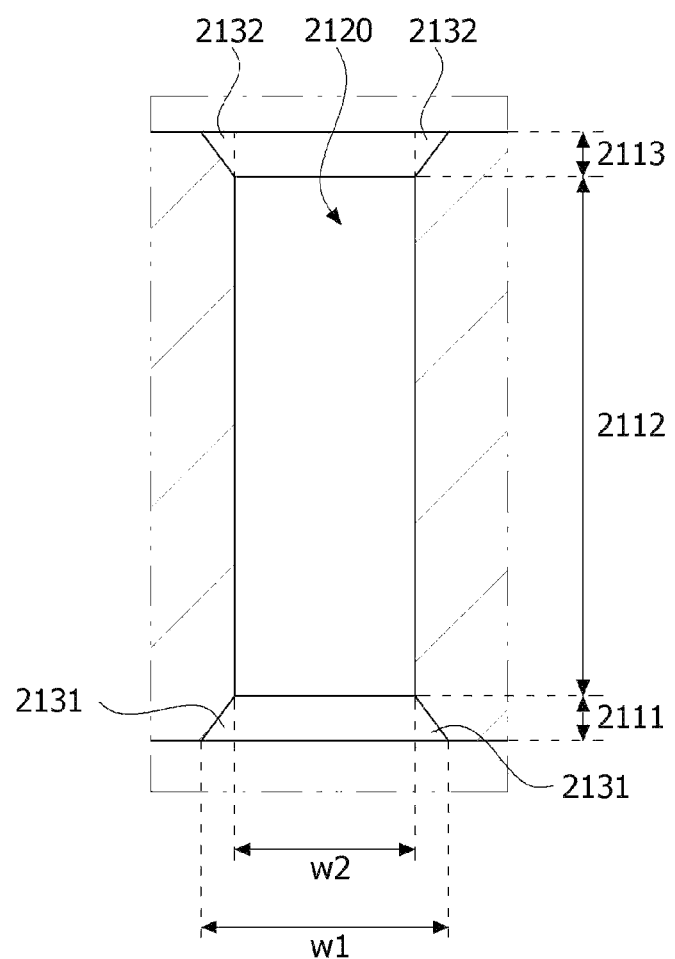
[FIG. 17]

[FIG. 18]
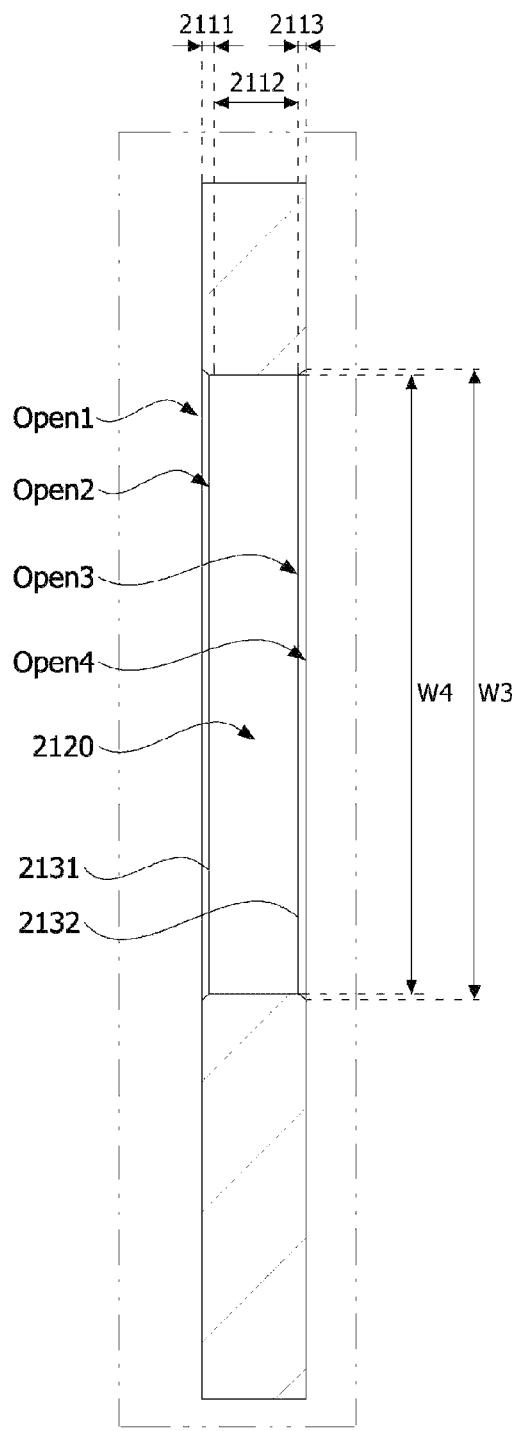

[FIG. 19]
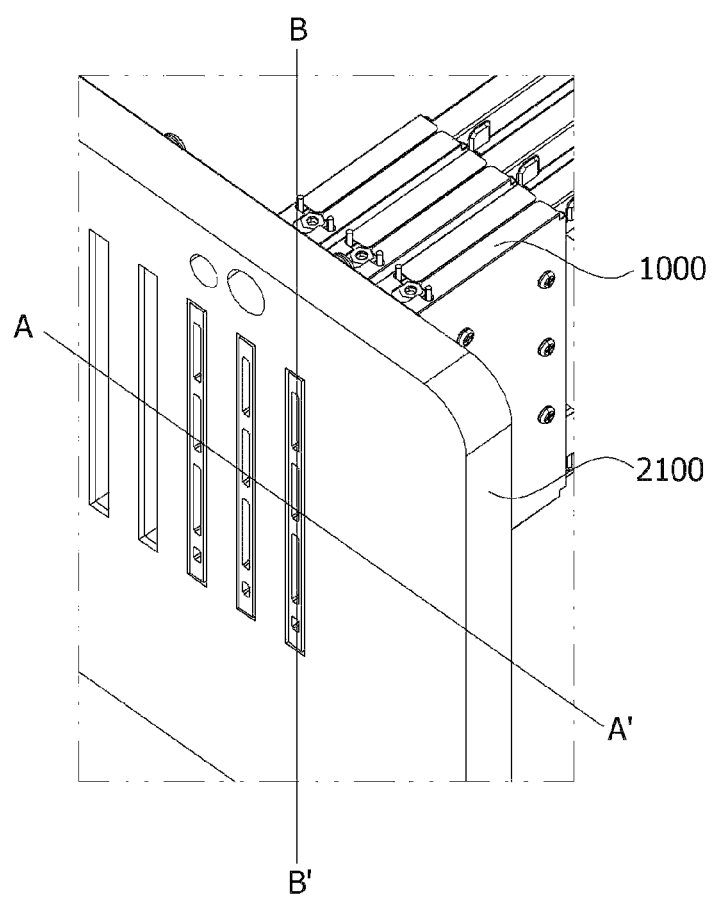

[FIG. 20]
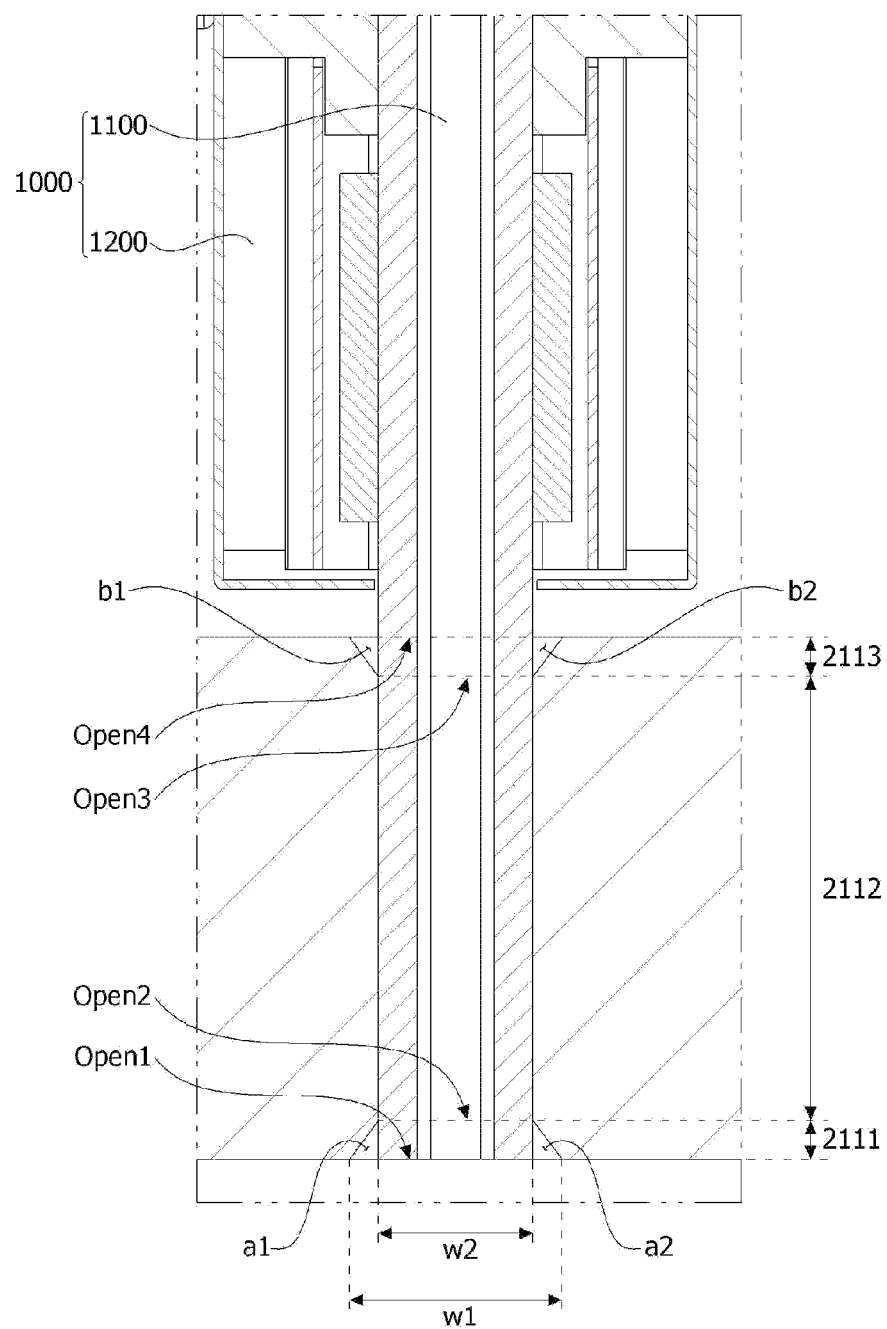

[FIG. 21]
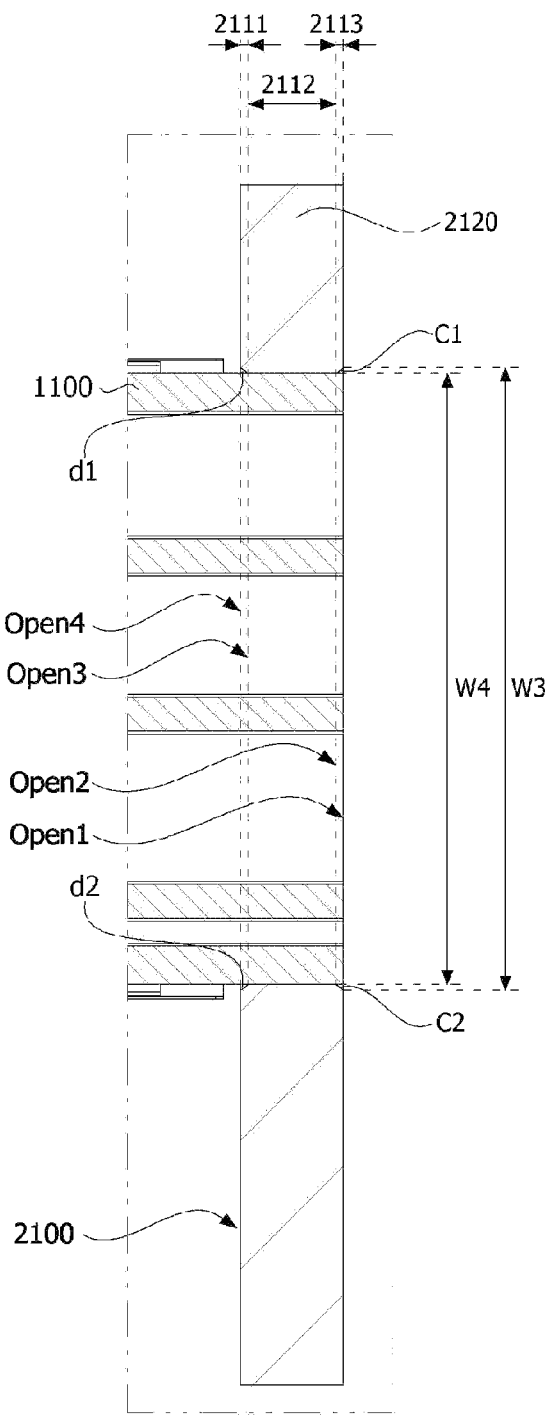

[FIG. 22]
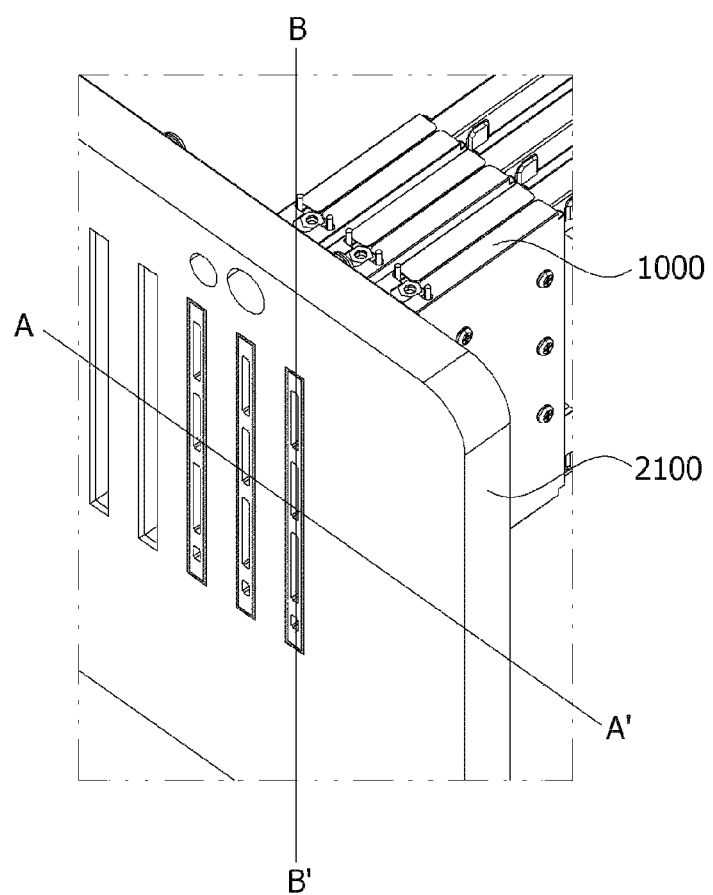

[FIG. 23]
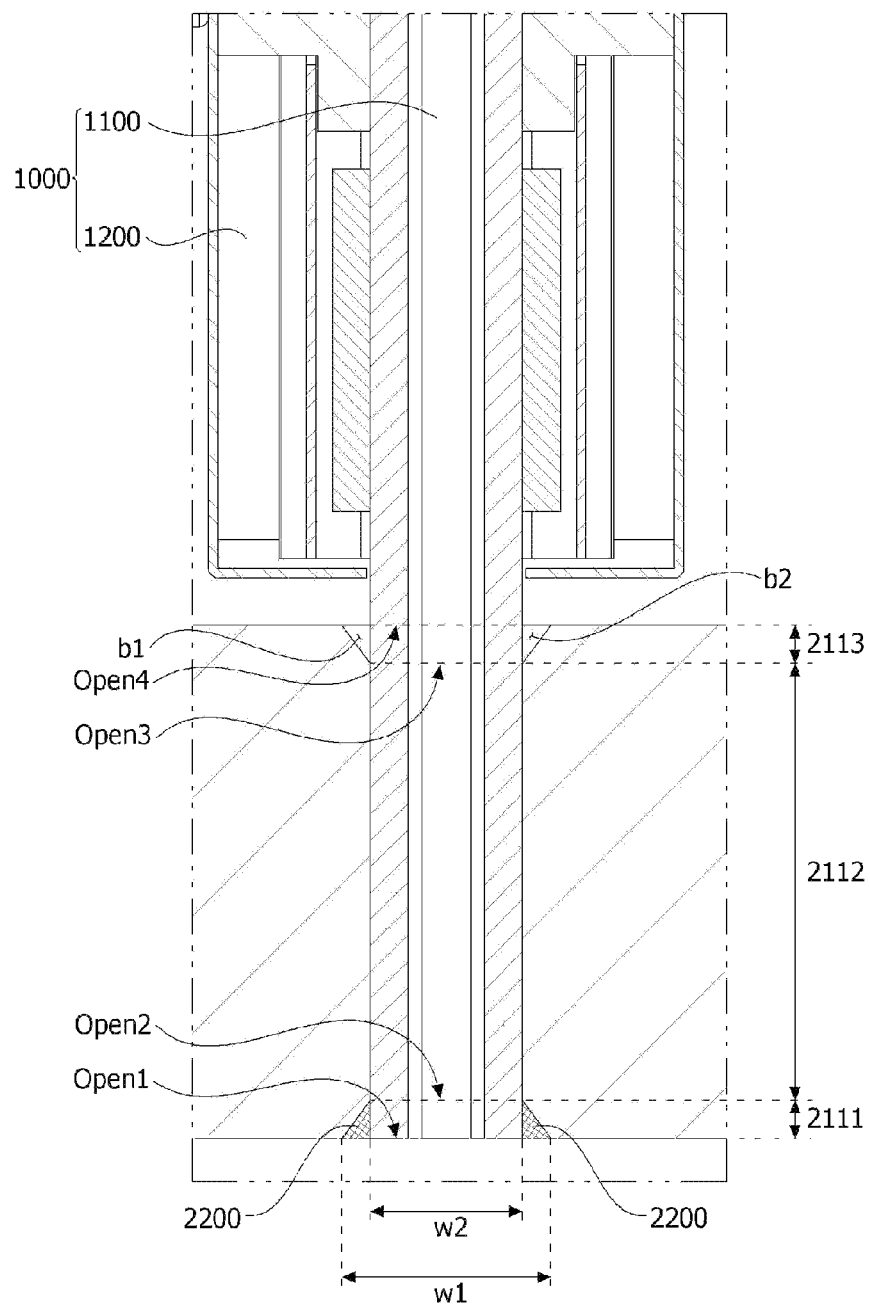

[FIG. 24]
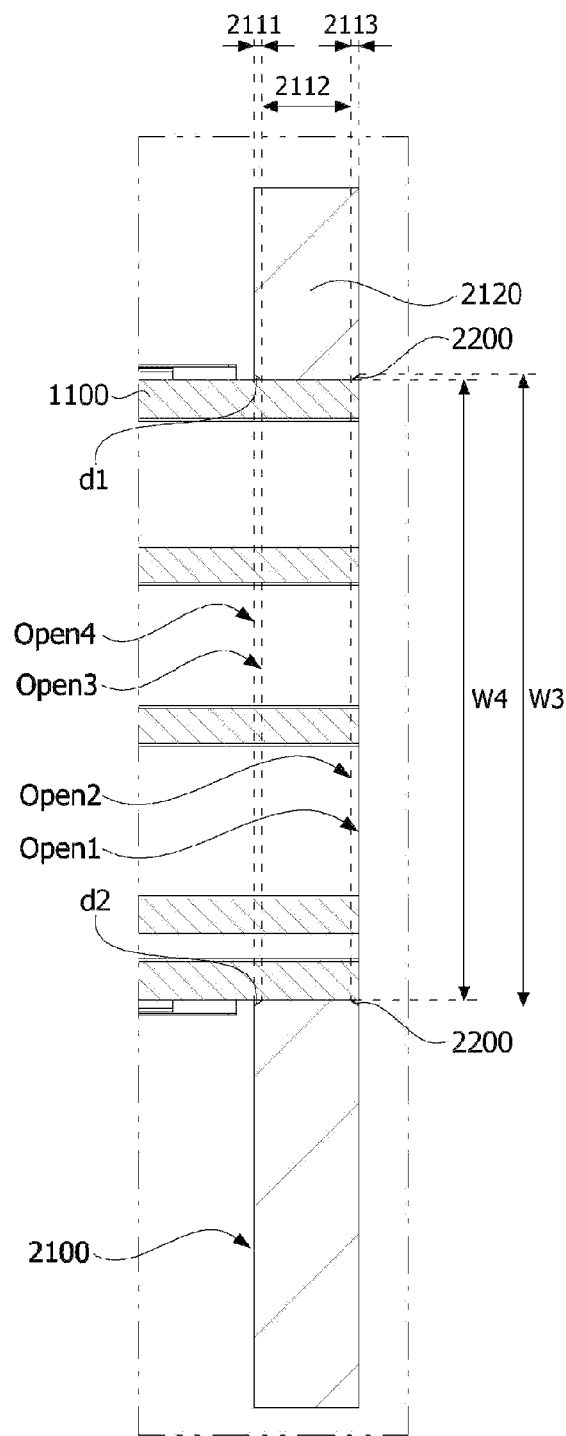

[FIG. 25]
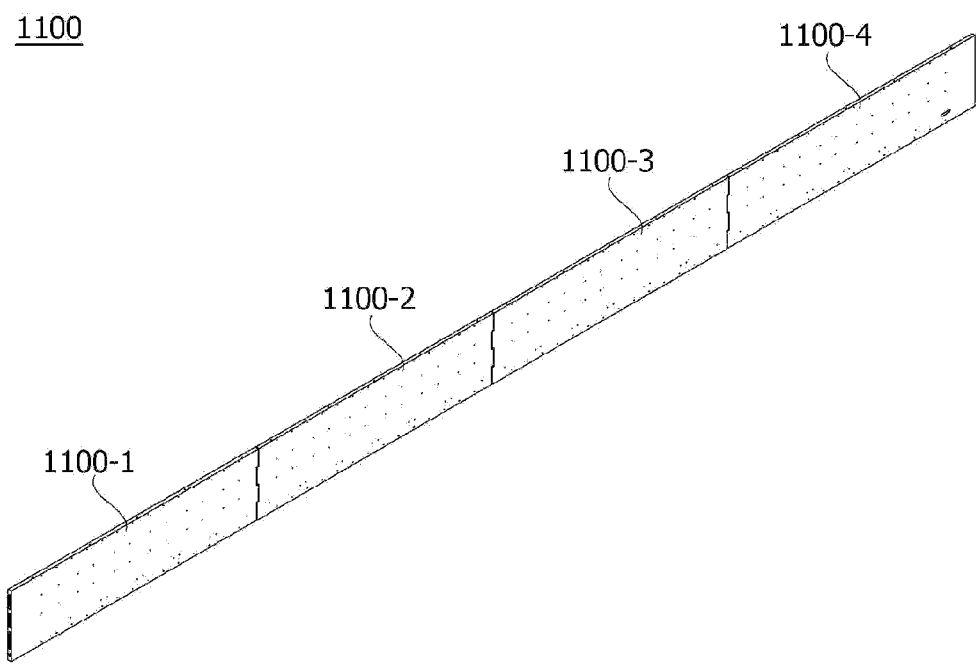
[FIG. 26]
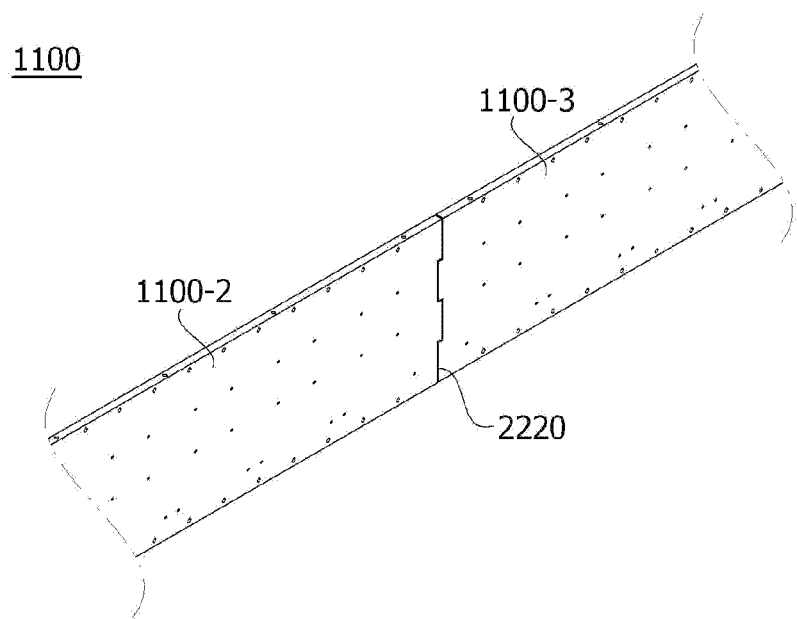

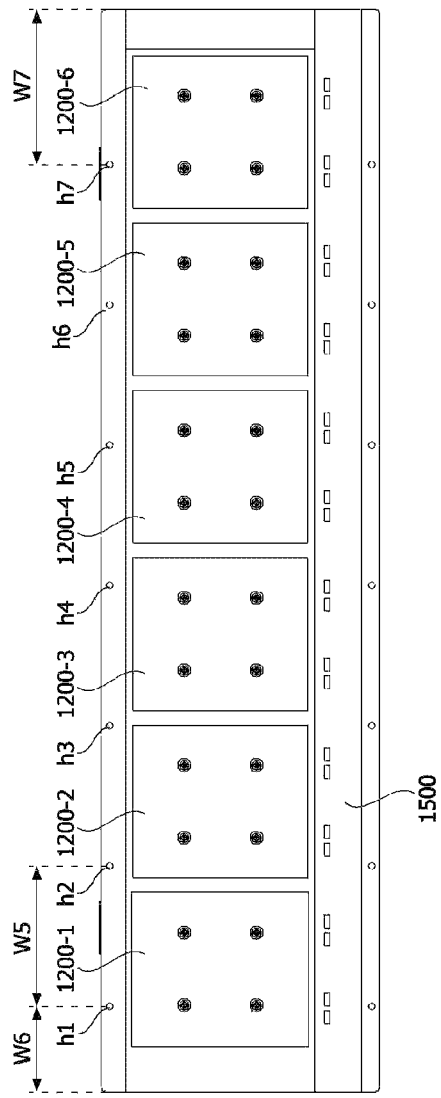
[FIG. 27]

THERMOELECTRIC MODULE AND POWER GENERATION APPARATUS INCLUDING THE SAME

CROSS REFERENCE TO RELATED APPLICATIONS

This application is the National Phase of PCT/KR2021/007426 filed on Jun. 15, 2021, which claims priority under 35 U.S.C. § 119(a) to Patent Application No. 10-2020-0072192, filed in the Republic of Korea on Jun. 15, 2020, and Patent Application No. 10-2020-0074230, filed in the Republic of Korea on Jun. 18, 2020, all of which are hereby expressly incorporated by reference into the present application.

TECHNICAL FIELD

The present invention relates to a thermoelectric module and a power generation apparatus including the same, and more particularly, to a thermoelectric module using a temperature difference between a low-temperature part and a high-temperature part of a thermoelectric element, and a power generation apparatus including the same, or a Peltier device configured to cool or heat a particular object such as a fluid.

BACKGROUND ART

The thermoelectric effect means direct conversion of energy between heat and electricity that is generated by movements of electrons and holes in a material.

Elements using the thermoelectric effect are collectively referred to as thermoelectric elements. The thermoelectric element has a structure in which a P-type thermoelectric material and an N-type thermoelectric material are joined between metal electrodes to define a PN junction pair.

The thermoelectric elements may be classified into an element using a change in temperature of electrical resistance, an element using the Seebeck effect that is a phenomenon in which a temperature difference generates an electromotive force, and an element using the Peltier effect that is a phenomenon in which heat absorption or heat generation occurs by an electric current.

The thermoelectric elements are variously applied to household electrical appliances, electronic components, communication components, and the like. For example, the thermoelectric elements may be applied to cooling devices, heating devices, power generation devices, and the like. Therefore, there is a gradually increasing need for thermoelectric performance of the thermoelectric element.

Recently, there is a need to generate electricity by using the thermoelectric element and high-temperature waste heat generated from an engine of a vehicle, a ship, or the like. In this case, a fluid flow part through which a first fluid passes is disposed at a side of a low-temperature part of the thermoelectric element, a heat sink is disposed at a side of a high-temperature part of the thermoelectric element, and a second fluid having a higher temperature than the first fluid may pass through the heat sink. Therefore, electricity may be generated by a temperature difference between the low-temperature part and the high-temperature part of the thermoelectric element.

DISCLOSURE

Technical Problem

A technical problem to be solved by the present invention is to provide a thermoelectric module using a temperature difference between a low-temperature part and a high-temperature part of a thermoelectric element, and a power generation apparatus including the same, or a Peltier device configured to cool or heat a particular object such as a fluid.

Technical Solution

A thermoelectric module according to an embodiment of the present invention includes: a substrate, thermoelectric elements disposed on the substrate and spaced apart from one another; and a cover member disposed on the substrate and disposed at one side of each of the thermoelectric elements, in which the cover member includes a first side surface closest to one side of the thermoelectric element, and a second side surface opposite to the first side surface, in which the first side surface includes a first groove concave toward the second side surface, in which the second side surface includes a second groove concave toward the first side surface, and in which a width of the first groove is larger than a width of the second groove.

The substrate may include a first region and a second region, the thermoelectric element may be disposed on the first region, and the connector part electrically connected to the thermoelectric element may be disposed on the second region.

The cover member may be disposed on the connector part.

The connector part may include a first connector and a second connector symmetrically disposed to be spaced apart from each other, and at least a part of the first connector and at least a part of the second connector may be disposed to perpendicularly overlap the first groove.

An electric wire may be connected to at least one of ends of the first connector and at least one of ends of the second connector that are disposed to perpendicularly overlap the first groove.

The cover member may include: a first cover region disposed on the first connector; and a second cover region disposed on the second connector, and the first groove may be disposed between the first cover region and the second cover region.

The cover member may further include a first guide region and a second guide region respectively protruding from the first cover region and the second cover region toward the substrate, the first guide region may be disposed on a side surface of the first connector, and the second guide region may be disposed on a side surface of the second connector.

The first and second guide regions may be in contact with the substrate.

One of two opposite surfaces of the cover member, which is directed toward the substrate, may have a plurality of grooves.

The second groove may include a curved surface having a predetermined curvature.

A third groove may be formed at an edge of the substrate.

The second groove and the third groove may be identical in at least one of the shape and the size to each other.

The thermoelectric module may further include a fluid flow part having one surface on which the substrate is disposed.

A plurality of first through-holes may be disposed at two opposite sides of the cover member and spaced apart from one another, and the fluid flow part, the substrate, and the cover member are coupled through the plurality of first through-holes.

A width of each of the first and second cover regions may be 0.8 to 0.95 times a width of each of the first and second connectors.

The width of each of the first and second cover regions may be larger than the width of each of the first and second connectors.

A system according to an embodiment of the present invention may include: a power generation apparatus including a duct, and a plurality of thermoelectric modules disposed on at least one surface of the duct; and a chamber including an internal space in which the power generation apparatus is disposed, and a coupling part coupled to the power generation apparatus, in which the coupling part includes a first recess disposed in an outer surface facing the internal space.

The system may include a first welding bead disposed in the first recess.

The first recess may have an inclination in a direction from an outer surface to an inner surface of the coupling part.

The first welding bead may be disposed to surround a side surface of the duct.

A part of the first welding bead may be disposed to protrude from an outer side of the chamber.

The first welding bead may be disposed so as not to protrude based on an outer side of the chamber.

The coupling part may include a second recess disposed in an inner surface thereof.

The first welding bead may be disposed in the second recess.

The duct may include a plurality of unit ducts. The plurality of unit ducts may each have one surface being in contact with the adjacent unit duct. A second welding bead may be disposed along a connection part formed as the surfaces of the unit ducts are in contact with each other.

The unit duct may include a plurality of fastening holes. A distance between a first coupling surface, which is in contact with the adjacent unit duct, and a fastening hole, which is closest to the first coupling surface among the plurality of fastening holes, may be smaller than a distance between the plurality of fastening holes.

A distance between a second coupling surface, which is in contact with the adjacent unit duct, and a fastening hole, which is closest to the second coupling surface among the plurality of fastening holes, may be smaller than the distance between the plurality of fastening holes.

Advantageous Effects

According to the embodiment of the present invention, it is possible to obtain the thermoelectric module, which may be simply assembled and have excellent power generation performance, and obtain the power generation apparatus including the same.

In particular, according to the embodiment of the present invention, it is possible to obtain the power generation apparatus in which the thermoelectric module and the fluid flow part are securely joined to reduce the thermal deformation by mitigating the thermal stress applied to the thermoelectric module.

In addition, according to the embodiment of the present invention, it is possible to obtain the power generation apparatus in which the electric wire is easily connected to the connector.

According to the embodiment of the present invention, it is possible to obtain the power generation system having excellent sealability.

According to the embodiment of the present invention, it is possible to obtain the power generation system having a high coupling force between the chamber and the power generation apparatus including the thermoelectric module.

DESCRIPTION OF DRAWINGS

FIG. 1 is a perspective view of a power generation system according to an embodiment of the present invention.

FIG. 2 is an exploded perspective view of the power generation system according to the embodiment of the present invention.

FIG. 3 is a perspective view of a power generation apparatus according to the embodiment of the present invention.

FIG. 4 is an exploded perspective view of the power generation apparatus according to the embodiment of the present invention.

FIGS. 5 and 6 are views illustrating a thermoelectric element according to the embodiment of the present invention.

FIG. 7 is a top plan view illustrating one surface of a fluid flow part included in the power generation apparatus according to the embodiment of the present invention.

FIG. 8 is a perspective view of a thermoelectric module included in the power generation apparatus according to the embodiment of the present invention.

FIG. 9 is a top plan view of a first substrate of the thermoelectric module included in the power generation apparatus according to the embodiment of the present invention.

FIG. 10 is a top plan view illustrating that a plurality of thermoelectric modules is disposed on one surface of the fluid flow part included in the power generation apparatus according to the embodiment of the present invention.

FIG. 11 is a top plan view illustrating that the plurality of thermoelectric modules and a plurality of cover members are disposed on one surface of the fluid flow part included in the power generation apparatus according to the embodiment of the present invention.

FIG. 12 is a top plan view illustrating that the plurality of thermoelectric modules and the plurality of cover members are disposed on one surface of the fluid flow part included in the power generation apparatus according to the embodiment of the present invention, and electric wires are connected to connectors.

FIG. 13 is a partially enlarged view of FIG. 12.

FIGS. 14A and 14B are views illustrating the cover member included in the power generation apparatus according to the embodiment of the present invention.

FIG. 15 is a perspective view illustrating a plate according to the embodiment of the present invention.

FIG. 16 is a partial perspective view illustrating a coupling part according to the embodiment of the present invention.

FIG. 17 is a partial cross-sectional view taken in a first direction A-A' and illustrating the coupling part.

FIG. 18 is a partial cross-sectional view taken in a second direction B-B' and illustrating the coupling part.

FIG. 19 is a partial perspective view illustrating a first plate and the power generation apparatus according to the embodiment of the present invention.

FIG. 20 is a partial cross-sectional view taken in the first direction A-A' and illustrating the first plate and the power generation apparatus.

FIG. 21 is a partial cross-sectional view taken in the second direction B-B' and illustrating the first plate and the power generation apparatus.

FIG. 22 is a partial perspective view illustrating the first plate, the power generation apparatus, and a welding bead according to the embodiment of the present invention.

FIG. 23 is a partial cross-sectional view taken in the first direction A-A' and illustrating the first plate, the power generation apparatus, and the welding bead.

FIG. 24 is a partial cross-sectional view taken in the second direction B-B' and illustrating the first plate, the power generation apparatus, and the welding bead.

FIG. 25 is a view illustrating the fluid flow part according to the embodiment of the present invention.

FIG. 26 is a view for explaining that unit fluid flow parts are coupled.

FIG. 27 is a top plan view illustrating the power generation apparatus according to the embodiment of the present invention.

MODE FOR INVENTION

Hereinafter, exemplary embodiments of the present invention will be described in detail with reference to the accompanying drawings.

However, the technical spirit of the present invention is not limited to some embodiments described herein but may be implemented in various different forms. One or more of the constituent elements in the embodiments may be selectively combined and substituted within the scope of the technical spirit of the present invention.

In addition, unless otherwise specifically and explicitly defined and stated, the terms (including technical and scientific terms) used in the embodiments of the present invention may be construed as the meaning which may be commonly understood by the person with ordinary skill in the art to which the present invention pertains. The meanings of the commonly used terms such as the terms defined in dictionaries may be interpreted in consideration of the contextual meanings of the related technology.

In addition, the terms used in the embodiments of the present invention are for explaining the embodiments, not for limiting the present invention.

In the present specification, unless particularly stated otherwise, a singular form may also include a plural form. The expression "at least one (or one or more) of A, B, and C" may include one or more of all combinations that can be made by combining A, B, and C.

In addition, the terms first, second, A, B, (a), and (b) may be used to describe constituent elements of the embodiments of the present invention.

These terms are used only for the purpose of discriminating one constituent element from another constituent element, and the nature, the sequences, or the orders of the constituent elements are not limited by the terms.

Further, when one constituent element is described as being 'connected,' 'coupled,' or 'attached' to another constituent element, one constituent element can be connected, coupled, or attached directly to another constituent element or connected, coupled, or attached to another constituent element through still another constituent element interposed therebetween.

In addition, the explanation "one constituent element is formed or disposed above (on) or below (under) another constituent element" includes not only a case in which the two constituent elements are in direct contact with each other, but also a case in which one or more additional constituent elements are formed or disposed between the two constituent elements. In addition, the expression "above (on) or below (under)" may include a meaning of a downward direction as well as an upward direction based on one constituent element.

FIG. 1 is a perspective view of a power generation system according to an embodiment of the present invention. FIG. 2 is an exploded perspective view of the power generation system according to the embodiment of the present invention.

Referring to FIGS. 1 and 2, the power generation system according to the embodiment of the present invention may include a power generation apparatus 1000, a chamber 2000, a guide member 3000, a wiring tube 4000, a channel cover 5000, and a junction box 6000.

The power generation apparatus 1000 may be disposed in the chamber 2000. The power generation apparatus 1000 may be provided as a plurality of power generation apparatuses 1000. The plurality of power generation apparatuses 1000 may be disposed in the chamber 2000. A portion of the power generation apparatus 1000 may be coupled to a coupling part of the chamber 2000. The portion of the power generation apparatus 1000 may be coupled by being inserted into a hole of the chamber 2000. A welding bead may be disposed between the chamber 2000 and the portion of the power generation apparatus 1000 that is inserted into the coupling part of the chamber 2000. The power generation apparatus 1000 may be fixed to the chamber 2000 by a welding member, and the interior of the chamber 2000 and the exterior of the chamber 2000 may be sealed by the welding member.

The power generation apparatus 1000 may include a duct and a plurality of thermoelectric modules. The duct may include a fluid inlet port, a fluid discharge port, and a fluid passage tube. The fluid inlet port may be provided as a plurality of fluid inlet ports, the fluid discharge port may be provided as a plurality of fluid discharge ports, and the fluid passage tube may be provided as a plurality of fluid passage tubes. The fluid inlet port may be disposed on at least one surface of the duct, and the fluid discharge port may be disposed on at least one surface of the duct. The fluid inlet port and the fluid discharge port may communicate with the fluid passage tube. The plurality of thermoelectric modules may be disposed on at least one surface of the duct. The plurality of thermoelectric modules may be disposed on at least one of a first surface of the duct and a second surface of the duct opposite to the first surface. The thermoelectric module may include a plurality of thermoelectric elements disposed on a substrate. The plurality of thermoelectric modules may be electrically connected to one another. The plurality of thermoelectric modules may be electrically connected to one another by means of a wire.

The chamber 2000 may include an internal space defined by a plurality of plates. The power generation apparatus 1000 may be disposed in the internal space of the chamber 2000. The chamber 2000 may include the coupling part to which the power generation apparatus 1000 is coupled. Because the plurality of power generation apparatuses 1000 may be disposed in the internal space of the chamber 2000, the coupling part may be provided as a plurality of coupling parts. The coupling part may include a first hole and a recess.

The chamber 2000 may include the plurality of plates. The plate may be provided as a plurality of plates. The plates may include a first plate 2100 and a second plate 2300. The first plate 2100 and the second plate 2300 may be disposed to be face each other. The first plate 2100 may be disposed to be spaced apart from the second plate 2300 at a predetermined interval. A spacing distance between the first plate 2100 and the second plate 2300 may be smaller than a length of the power generation apparatus 1000.

The coupling parts may be disposed on the first and second plates 2100 and 2300. Therefore, the first holes and the recesses may be disposed in the first and second plates 2100 and 2300. The first hole formed in the first plate 2100 and the first hole formed in the second plate 2300 may be disposed to face each other. The number of first holes formed in the first plate 2100 and the number of first holes formed in the second plate 2300 may be equal to each other. One end of the power generation apparatus 1000 may be inserted into the first hole formed in the first plate 2100. The other end of the power generation apparatus 1000 may be inserted into the first hole of the second plate 2300 that is disposed to face the hole formed in the first plate 2100. After the power generation apparatus is inserted into the first hole, the welding bead may be disposed in the recess.

The plates may include a third plate 2500 and a fourth plate 2700. The third plate 2500 and the fourth plate 2700 may be disposed to face each other. The third plate 2500 may be disposed to be spaced apart from the fourth plate 2700 at a predetermined interval. The third plate 2500 may be coupled to the first and second plates 2100 and 2300. The fourth plate 2700 may be coupled to the first and second plates 2100 and 2300. The first plate 2100, the second plate 2300, the third plate 2500, and the fourth plate 2700 may be coupled to one another to define the internal space. The third and fourth plates 2500 and 2700 may be coupled to the first and second plates 2100 and 2300 after the power generation apparatus 1000 is inserted into the first holes of the first and second plates 2100 and 2300.

The guide member 3000 may be coupled to the chamber 2000. The guide member 3000 may be coupled to a second hole formed in the first plate of the chamber 2000. The guide member 3000 may be disposed on an upper surface of one side of the power generation apparatus 1000.

The guide member 3000 may include a casing 3100 and a cover 3500. The casing 3100 may have a durable space that may accommodate a molding material An upper side of the casing 3100 may be opened. A wiring hole may be disposed in a lower surface of the casing 3100, and a wire extending from the power generation apparatus 1000 may pass through the wiring hole. A pipe may be disposed on one side surface of the casing 3100. The pipe may be inserted into the second hole formed in the first plate. The wire passing through the wiring hole may pass through the interior of the pipe. The cover 3500 may be disposed at the upper side of the casing 3100. The cover 3500 may be coupled to the upper side of the casing 3100 after the internal space of the casing 3100 is filled with a molding member.

The channel cover 5000 may be disposed at an outer side of the chamber 2000. The channel cover 5000 may be disposed on the outer side of the first plate of the chamber 2000. A groove may be formed at one side of the channel cover 5000, and the pipe of the guide member 3000 may be disposed in the groove.

The wiring tube 4000 may be disposed between the guide member 3000 and the junction box 6000. The wire passing through the pipe of the guide member 3000 may pass through the interior of the wiring tube 4000. The wire passing through the wiring tube 4000 may be connected to the junction box 6000.

The junction box 6000 may be disposed on one surface of the channel cover 5000. The junction box 6000 may be disposed on an outer surface of the channel cover. The junction box 6000 may be connected to the wire passing through the tube. The junction box 6000 may be electrically connected to the thermoelectric module of the power generation apparatus 1000 through the wire.

FIG. 3 is a perspective view of the power generation apparatus according to the embodiment of the present invention, and FIG. 4 is an exploded perspective view of the power generation apparatus according to the embodiment of the present invention.

Referring to FIGS. 3 to 4, the power generation apparatus 1000 includes a fluid flow part 1100, and a thermoelectric module 1200 disposed on a surface of the fluid flow part 1100. The plurality of power generation apparatuses 1000 may be disposed in parallel so as to be spaced apart from one another at predetermined intervals, thereby defining the power generation system.

The power generation apparatus 1000 according to the embodiment of the present invention may produce electric power by using a temperature difference between a first fluid flowing through the interior of the fluid flow part 1100 and a second fluid passing through the exterior of the fluid flow part 1100.

The first fluid introduced into the fluid flow part 1100 may be, but not limited to, water. Various types of fluids having cooling performance may be used as the first fluid. A temperature of the first fluid introduced into the fluid flow part 1100 may be, but not limited to, less than 100° C., particularly less than 50° C., and more particularly less than 40° C. The first fluid may be a fluid having a lower temperature than the second fluid. A temperature of the first fluid, which is discharged after passing through the fluid flow part 1100, may be higher than a temperature of the first fluid to be introduced into the fluid flow part 1100.

The first fluid is introduced from the fluid inlet port of the fluid flow part 1100 and then discharged through the fluid discharge port of the fluid flow part 1100. To make it easy to introduce and discharge the first fluid and support the fluid flow part 1100, an inlet port flange (not illustrated) and a discharge port flange (not illustrated) may be further respectively disposed at a side of the fluid inlet port of the fluid flow part 1100 and a side of the fluid discharge port of the fluid flow part 1100. Alternatively, a plurality of fluid inlet ports (not illustrated) may be formed on a fifth surface 1150 of the fluid flow part 1100 that is disposed to be perpendicular to a first surface 1110, a second surface 1120 disposed to be opposite to the first surface 1110, and a third surface 1130 disposed between the first surface 1110 and the second surface 1120. A plurality of fluid discharge ports 1162 may be formed in a sixth surface 1160 opposite to the fifth surface 1150. The plurality of fluid inlet ports (not illustrated) and the plurality of fluid discharge ports 1162 may be connected to a plurality of fluid passage tubes (not illustrated) provided in the fluid inlet part 1100. Therefore, the first fluid introduced into the fluid inlet ports may pass through the fluid passage tubes and then be discharged from the fluid discharge ports 1162.

However, this is provided for illustrative purposes only, and the number, positions, and shapes of the fluid inlet ports and the fluid discharge ports are not limited thereto. The fluid flow part 1100 may have a single fluid inlet port, a single fluid discharge port, and a fluid passage tube configured to connect the fluid inlet port and the fluid discharge port.

Meanwhile, the second fluid passes through the outside of the fluid flow part 1100, e.g., a heat sink 1220 of the thermoelectric module 1200 that is disposed outside the fluid flow part 1100. The second fluid may be, but not limited to, waste heat generated from an engine of a vehicle, a ship, or the like. For example, the temperature of the second fluid may be, but not limited to, 100° C. or more, particularly 200° C. or more, and more particularly 220° C. to 250° C. The second fluid may be a fluid having a higher temperature than the temperature of the first fluid.

In the present specification, an example will be described in which the temperature of the first fluid flowing through the interior of the fluid flow part 1100 is lower than the temperature of the second fluid passing through the heat sink 1220 of the thermoelectric module 1200 that is disposed outside the fluid flow part 1100. Therefore, in the present specification, the fluid flow part 1100 may be referred to as a duct or a cooling part. However, the embodiment of the present invention is not limited thereto, and the temperature of the first fluid flowing through the interior of the fluid flow part 1100 may be higher than the temperature of the second fluid passing through the heat sink 1220 of the thermoelectric module 1200 that is disposed outside the fluid flow part 1100.

According to the embodiment of the present invention, the thermoelectric module 1200 may include a thermoelectric element 1210, and the heat sink 1220 disposed on the thermoelectric element 1210. The thermoelectric element 1210 according to the embodiment of the present invention may have a structure of a thermoelectric element 100 illustrated in FIGS. 5 and 6.

Referring to FIGS. 5 and 6, the thermoelectric element 100 includes a first substrate 110, first electrodes 120, a P-type thermoelectric leg 130, an N-type thermoelectric leg 140, a second electrode 150, and a second substrate 160.

The first electrodes 120 are respectively disposed between the first substrate 110 and a lower bottom surface of the P-type thermoelectric leg 130 and between the first substrate 110 and a lower bottom surface of the N-type thermoelectric leg 140. The second electrode 150 is disposed between the second substrate 160 and an upper bottom surface of the P-type thermoelectric leg 130 and an upper bottom surface of the N-type thermoelectric leg 140. Therefore, a plurality of P-type thermoelectric legs 130 and a plurality of N-type thermoelectric legs 140 are electrically connected to one another by the first and second electrodes 120 and 150. A pair of P-type and N-type thermoelectric legs 130 and 140, which are disposed between the first and second electrodes 120 and 150 and electrically connected to each other, may define a unit cell.

For example, when a voltage is applied to the first and second electrodes 120 and 150 through lead wires 181 and 182, the substrate in which an electric current flows from the P-type thermoelectric leg 130 to the N-type thermoelectric leg 140 may operate as a cooling part by absorbing heat, and the substrate in which an electric current flows from the N-type thermoelectric leg 140 to the P-type thermoelectric leg 130 may operate as a heat generation part by being heated, according to the Peltier effect. Alternatively, when a temperature difference occurs between the first and second electrodes 120 and 150, electric charges may move in the P-type thermoelectric leg 130 and the N-type thermoelectric leg 140, such that electricity may be generated according to the Seebeck effect.

In this case, the P-type thermoelectric leg 130 and the N-type thermoelectric leg 140 may each be a bismuth telluride (Bi—Te) based thermoelectric leg containing bismuth (Bi) and tellurium (Te) as main ingredients. The P-type thermoelectric leg 130 may be a bismuth telluride (Bi—Te) based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may contain 99 to 99.999 wt % of Bi—Sb—Te, which is a main ingredient material, and 0.001 to 1 wt % of at least one of nickel (Ni), aluminum (Al), copper (Cu), silver (Ag), lead (Pb), boron (B), gallium (Ga), and indium (In), with respect to a total weight of 100 wt %. The N-type thermoelectric leg 140 may be a bismuth telluride (Bi—Te) based thermoelectric leg containing at least one of selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may contain 99 to 99.999 wt % of Bi—Se—Te, which is a main ingredient material, and 0.001 to 1 wt % of at least one of nickel (Ni), aluminum (Al), copper (Cu), silver (Ag), lead (Pb), boron (B), gallium (Ga), and indium (In), with respect to a total weight of 100 wt %.

The P-type thermoelectric leg 130 and the N-type thermoelectric leg 140 may each be formed as a bulky or stacked type. In general, the bulky P-type thermoelectric leg 130 or the bulky N-type thermoelectric leg 140 may be obtained by a process of manufacturing an ingot by thermally treating a thermoelectric material, a process of obtaining thermoelectric leg powder by grinding and screening the ingot, a process of sintering the thermoelectric leg powder, and a process of cutting the sintered body. In this case, the P-type thermoelectric leg 130 and the N-type thermoelectric leg 140 may each be a polycrystalline thermoelectric leg. In case that the P-type thermoelectric leg 130 and the N-type thermoelectric leg 140 are each a polycrystalline thermoelectric leg as described above, the strength of the P-type thermoelectric leg 130 and the N-type thermoelectric leg 140 may be improved. The stacked P-type thermoelectric leg 130 or the stacked N-type thermoelectric leg 140 may be obtained by a process of forming a unit member by applying a paste containing a thermoelectric material onto a sheet-shaped substrate, a process of stacking the unit members, and a process of cutting the stacked unit members.

In this case, the pair of P-type and N-type thermoelectric legs 130 and 140 may have the same shape and volume or different shapes and volumes. For example, because the P-type thermoelectric leg 130 and the N-type thermoelectric leg 140 are different in electrical conductivity from each other, a height or cross-sectional area of the N-type thermoelectric leg 140 may be different from a height or cross-sectional area of the P-type thermoelectric leg 130.

In this case, the P-type thermoelectric leg 130 or the N-type thermoelectric leg 140 may have a cylindrical shape, a polyprismatic shape, an elliptical column shape or the like.

In the present specification, the thermoelectric leg may be referred to as a thermoelectric structure, a semiconductor element, a semiconductor structure, or the like.

The performance of the thermoelectric element according to the embodiment of the present invention may be expressed by a thermoelectric figure of merit (ZT). The thermoelectric figure of merit (ZT) may be expressed by Equation 1.

$$ZT = \alpha^2 \cdot \sigma \cdot T/k \quad \text{[Equation 1]}$$

Here, α represents a Seebeck coefficient [V/K], σ represents electrical conductivity [S/m], and $\alpha^2\sigma$ represents a power factor [W/mK$^2$]. Further, T represents a temperature, and k represents thermal conductivity [W/mK]. k may be expressed as a·cp·ρ, a represents thermal diffusivity [cm$^2$/S], cp represents specific heat [J/gK], and ρ represents density [g/cm$^3$].

To obtain the thermoelectric figure of merit of the thermoelectric element, a Z value (V/K) may be measured by using a Z meter, and the thermoelectric figure of merit (ZT) may be calculated by using the measured Z value.

In this case, the first electrodes 120 may be respectively disposed between the first substrate 110 and the P-type thermoelectric leg 130 and between the first substrate 110 and the N-type thermoelectric leg 140. The second electrode 150 may be disposed between the second substrate 160 and the P-type thermoelectric leg 130 and the N-type thermoelectric leg 140. The first and second electrodes 120 and 150 may each contain at least one of copper (Cu), silver (Ag), aluminum (Al), and nickel (Ni) and each have a thickness of 0.01 mm to 0.3 mm. In case that a thickness of the first electrode 120 or the second electrode 150 is less than 0.01 mm, a function of the electrode deteriorates, which may decrease electrical conduction performance. In case that a thickness of the first electrode 120 or the second electrode 150 is more than 0.3 mm, resistance increases, which may degrade conduction efficiency.

Further, the first and second substrates 110 and 160, which face each other, may each be a metal substrate and each have a thickness of 0.1 mm to 1.5 mm. In case that a thickness of the metal substrate is less than 0.1 mm or more than 1.5 mm, the heat dissipation properties or thermal conductivity may be excessively increased, which may degrade reliability of the thermoelectric element. In addition, in case that the first and second substrates 110 and 160 are each a metal substrate, insulating layers 170 may be further and respectively formed between the first substrate 110 and the first electrodes 120 and between the second substrate 160 and the second electrode 150. The insulating layer 170 may contain a material having thermal conductivity of 1 to 20 W/mK. In this case, the insulating layer 170 may be a layer made of a resin composition containing an inorganic material and at least one of epoxy resin and silicone resin, a layer configured as a silicone composite body containing silicone and an inorganic material, or an aluminum oxide layer. In this case, the inorganic material may be at least one of oxide, nitride, and carbide of aluminum, boron, silicon, and the like.

In this case, the first and second substrates 110 and 160 may have different sizes. That is, a volume, thickness, or area of one of the first and second substrates 110 and 160 may be larger than a volume, thickness, or area of the other of the first and second substrates 110 and 160. In this case, the thickness may be a thickness in a direction from the first substrate 110 toward the second substrate 160. The area may be an area in a direction perpendicular to the direction from the first substrate 110 toward the second substrate 160. Therefore, it is possible to improve the heat absorption performance or heat dissipation performance of the thermoelectric element. Particularly, the volume, thickness, or area of the first substrate 110 may be larger than at least one of the volume, thickness, and area of the second substrate 160. In this case, at least one of the volume, thickness, and area of the first substrate 110 may be larger than at least one of the volume, thickness, and area of the second substrate 160 in case that the first substrate 110 is disposed in a high-temperature region to implement the Seebeck effect, in case that the first substrate 110 is applied as a heat absorption region to implement the Peltier effect, or in case that a sealing member to be described below is disposed on the first substrate 110 to protect the first substrate 110 from an external environment of the thermoelectric element. In this case, the area of the first substrate 110 may be defined within a range of 1.2 to 5 times the area of the second substrate 160. In case that the area of the first substrate 110 is less than 1.2 times the area of the second substrate 160, this does not greatly affect the improvement in heat transfer efficiency. In case that the area of the first substrate 110 is more than 5 times the area of the second substrate 160, the heat transfer efficiency may rather remarkably deteriorate, and a basic shape of the thermoelectric module may be hardly maintained.

In addition, a heat dissipation pattern, e.g., a concave-convex pattern may be formed on a surface of at least one of the first and second substrates 110 and 160. Therefore, it is possible to improve the heat dissipation performance of the thermoelectric element. In case that the concave-convex pattern is formed on a surface of the substrate that is in contact with the P-type thermoelectric leg 130 or the N-type thermoelectric leg 140, junction characteristics between the thermoelectric leg and the substrate may be improved.

Although not illustrated, the sealing member may be further disposed between the first and second substrates 110 and 160. The sealing member may be provided between the first and second substrates 110 and 160 and disposed on each of a side surface of the first electrode 120, a side surface of the P-type thermoelectric leg 130, a side surface of the N-type thermoelectric leg 140, and a side surface of the second electrode 150. Therefore, the first electrode 120, the P-type thermoelectric leg 130, the N-type thermoelectric leg 140, and the second electrode 150 may be sealed from outside moisture, heat, contaminants, and the like.

Referring back to FIGS. 3 and 4, the thermoelectric module 1200 according to the embodiment of the present invention may include the thermoelectric element 1210, and the heat sink 1220 disposed on the thermoelectric element 1210. FIGS. 3 and 4 illustrate that two thermoelectric modules 1200-1 and 1200-2 are disposed on the first surface 1110 of the fluid flow part 1100, and two thermoelectric modules 1200-3 and 1200-4 are also disposed on the second surface 1120, but the present invention is not limited thereto. Two or more thermoelectric modules may be disposed on a single surface.

As described above, the thermoelectric elements 1210 each include: the first substrate 110 disposed to be in contact with the fluid flow part 1100; the plurality of first electrodes 120 disposed on the first substrate 110; the plurality of thermoelectric legs 130 and 140 disposed on the plurality of first electrodes 120; the plurality of second electrodes 150 disposed on the plurality of thermoelectric legs 130 and 140; and the second substrate 160 disposed on the plurality of second electrodes 150. The heat sink 1220 is disposed on the second substrate 160. Further, the insulating layers 170 may be further and respectively disposed between the first substrate 110 and the plurality of first electrodes 120 and between the plurality of second electrodes 150 and the second substrate 160.

In this case, the first substrate of the thermoelectric element 1210, which is disposed on the fluid flow part 1100, may be a metal substrate, and the metal substrate may be bonded to the surface of the fluid flow part 1100 by a heat transfer material (a thermal interface material (TIM, not illustrated)). Because the metal substrate is excellent in heat transfer performance, the heat transfer between the thermoelectric element and the fluid flow part 1100 is facilitated. In addition, when the metal substrate and the fluid flow part 1100 are bonded by the heat transfer material (thermal interface material (TIM)), the heat transfer between the metal substrate and the fluid flow part 1100 may not be hindered. In this case, the metal substrate may be, but not limited to, one of a copper substrate, an aluminum substrate, and a copper-aluminum substrate.

As described above, according to the embodiment of the present invention, the plurality of thermoelectric modules 1200 is disposed on the surfaces of the fluid flow part 1100. The plurality of thermoelectric modules 1200 may each include a connector configured to extract produced electricity to the outside or apply electricity to use the thermoelectric module as the Peltier module. According to the embodiment of the present invention, a cover member 1400 may be disposed on the connector to uniformly maintain a joining force between the thermoelectric module 1200 and the fluid flow part 1100 and protect a conductive wire connected to the connector.

FIG. 7 is a top plan view illustrating one surface of the fluid flow part included in the power generation apparatus according to the embodiment of the present invention, FIG. 8 is a perspective view of the thermoelectric module included in the power generation apparatus according to the embodiment of the present invention, and FIG. 9 is a top plan view of the first substrate of the thermoelectric module included in the power generation apparatus according to the embodiment of the present invention. FIG. 10 is a top plan view illustrating that the plurality of thermoelectric modules is disposed on one surface of the fluid flow part included in the power generation apparatus according to the embodiment of the present invention, FIG. 11 is a top plan view illustrating that the plurality of thermoelectric modules and the plurality of cover members are disposed on one surface of the fluid flow part included in the power generation apparatus according to the embodiment of the present invention, and FIG. 12 is a top plan view illustrating that the plurality of thermoelectric modules and the plurality of cover members are disposed on one surface of the fluid flow part included in the power generation apparatus according to the embodiment of the present invention, and the electric wires are connected to the connectors. FIG. 13 is a partially enlarged view of FIG. 12, and FIGS. 14A and 14B are views illustrating the cover member included in the power generation apparatus according to the embodiment of the present invention.

Referring to FIGS. 7 to 14B, the thermoelectric modules 1200 are disposed on the first surface 1110 of the fluid flow part 1100. Hereinafter, for convenience of description, only the thermoelectric module 1200 disposed on the first surface 1110 of the fluid flow part 1100 will be described, but the present invention is not limited thereto. The same structure may be applied to the second surface 1120 opposite to the first surface 1110. A repeated description of the contents identical to the contents related to the fluid flow part 1100 and the thermoelectric module 1200 described with reference to FIGS. 3 to 6 will be omitted.

According to the embodiment of the present invention, a first substrate 1212 of the thermoelectric module 1200 is disposed on the first surface 1110 of the fluid flow part 1100. In this case, the first substrate 1212 may be disposed to be in direct contact with the first surface 1110 of the fluid flow part 1100 or disposed to be in indirect contact with the first surface 1110 of the fluid flow part 1100 by means of the heat transfer material (thermal interface material (TIM)) or the like. The first substrate 1212 may be the first substrate 110 that has been described with reference to FIGS. 1 to 4. Therefore, a repeated description of the contents related to the first substrate 1212, which are identical to the contents related to the first substrate 110 described with reference to FIGS. 3 to 6, will be omitted.

As illustrated in FIGS. 8 and 9, the first substrate 1212 of the thermoelectric module 1200 may include a first region A1 and a second region A2. In this case, the plurality of first electrodes, the plurality of thermoelectric legs, the plurality of second electrodes, the second substrate, and the heat sink 1220 may be disposed in the first region A1. Connector parts 210 and 220 connected to the first electrodes may be disposed in the second region A2 provided at one side of the first region A1. In this case, the plurality of first electrodes, the plurality of thermoelectric legs, the plurality of second electrodes, and the second substrate may be the plurality of first electrodes 120, the plurality of thermoelectric legs 130 and 140, the plurality of second electrodes 150, and the second substrate 160 described with reference to FIGS. 3 to 6.

According to the embodiment of the present invention, the fluid flow part 1100 and the thermoelectric modules 1200 may be coupled by coupling members 1300. To this end, a plurality of first-first through-holes S11 may be formed in the first surface 1110 of the fluid flow part 1100, and a plurality of first-second through-holes S12 corresponding to the plurality of first-first through-holes S11 may also be formed in the first region A1 of the first substrate 1212 of the thermoelectric module 1200. In addition, a plurality of first-third through-holes S13 corresponding to the plurality of first-first through-holes S11 and the plurality of first-second through-holes S12 may also be formed in the heat sink 1220 and the second substrate (not illustrated) of the thermoelectric module 1200. According to this configuration, as illustrated in FIGS. 10 to 13, a plurality of first coupling members 1310 may be coupled to the plurality of first-first through-holes S11, the plurality of first-second through-holes S12, and the plurality of first-third through-holes S13, such that the fluid flow part 1100 and the thermoelectric module 1200 may be coupled.

Meanwhile, according to the embodiment of the present invention, a plurality of second-first through-holes S21 may be further formed in the first surface 1110 of the fluid flow part 1100, and a plurality of second-second through-holes S22 corresponding to the plurality of second-first through-holes S21 may also be further formed in the second region A2 of the first substrate 1212 of the thermoelectric module 1200. Further, the cover member 1400 may be further disposed in the second region A2 of the first substrate 1212. As illustrated in FIGS. 14A and 14B, a plurality of second-third through-holes S23 corresponding to the plurality of second-first through-holes S21 and the plurality of second-second through-holes S22 may be formed in the cover member 1400. A plurality of second coupling members 1320 may be coupled to the plurality of second-first through-holes S21, the plurality of second-second through-holes S22, and the plurality of second-third through-holes S23, such that the fluid flow part 1100, the thermoelectric module 1200, and the cover member 1400 may be coupled.

According to this configuration, not only the first region A1 of the first substrate 1212 of the thermoelectric module 1200 but also the second region A2 of the first substrate 1212 of the thermoelectric module 1200 may be coupled to the fluid flow part 1100. Therefore, a uniform joining force may be applied between the fluid flow part 1100 and the entire first substrate 1212 of the thermoelectric module 1200, and heat may be uniformly distributed on the entire first substrate 1212.

In particular, as illustrated in FIG. 13, in case that the first substrate 1212 of the thermoelectric module 1200 is coupled to the fluid flow part 1100 by the cover member 1400, fastening torque of the second coupling member 1320 may be increased by applying the cover member 1400. According to this configuration, because it is unlikely that the second coupling member 1320 will be loosened even under a vibration condition, the thermoelectric module 1200 may be more securely attached to the fluid flow part 1100.

In this case, a width D of the cover member 1400 may be almost equal to a width D' of the first substrate 1212 on which the cover member 1400 is disposed. For example, the width D of the cover member 1400 may be 0.9 to 1 times, particularly 0.925 to 1 times, and more particularly, 0.95 to 1 times the width D' of the first substrate 1212 on which the cover member 1400 is disposed. According to this configuration, the cover member 1400 may press the overall width D' of the first substrate 1212, which makes it possible to prevent the deformation or withdrawal of the first substrate 1212.

More specifically, the plurality of second-third through-holes S23 may be formed at two opposite sides of the cover member 1400. Therefore, it is possible to uniformly support two opposite sides of the second region A2 of the first substrate 1212 in a balanced manner and to prevent the thermal deformation of the first substrate 1212. In this case, an interval d3 between two second-third through-holes S23 in one cover member 1400 may be larger than an interval d4 between two first-third through-holes S13 in one heat sink 1220. According to this configuration, the cover member 1400 may uniformly support two opposite sides of the second region A2 of the first substrate 1212 in a balanced manner.

Meanwhile, as illustrated in FIGS. 14A and 14B, the plurality of second-third through-holes S23 formed at the two opposite sides of the cover member 1400 may each have an inner wall having a stepped portion. That is, a diameter d1 of the second-third through-hole S23 in a first surface 1402 of two opposite surfaces of the cover member 1400, which is disposed to be directed toward the first substrate 1212, may be smaller than a diameter d2 of the second-third through-hole S23 in a second surface 1404 opposite to the first surface 1402 of the cover member 1400. The inner wall of the second-third through-hole S23 may have a stepped portion 1406. According to this configuration, a head of the second coupling member 1320 may be disposed on the stepped portion 1406 formed on the inner wall of the second-third through-hole S23.

In this case, the cover member 1400 may contain an insulating material, e.g., a plastic material. According to this configuration, the head of the second coupling member 1320 may be in contact with the cover member 1400, such that the first substrate 1212 containing metal and the head of the second coupling member 1320 may be insulated, and the voltage resistance performance of the thermoelectric module 1200 may be improved.

In addition, in case that the cover member 1400 contains a plastic material, the cover member 1400 may be easily formed in various sizes and shapes. More specifically, the cover member 1400 may be made of a plastic material such as polyphenylene sulfide (PPS) that may be applied at a high temperature. According to this configuration, it is possible to prevent the cover member 1400 from being deformed in shape by the high-temperature second fluid.

As described above, because the cover member 1400 and the first substrate 1212 are coupled by the coupling members 1320 passing through the plurality of second-third through-holes S23, a region including the plurality of second-third through-holes S23 may be referred to as a coupling part 1400A. The coupling part 1400A includes a first side surface 1410 closest to one side of the thermoelectric element 1210, and a second side surface 1420 disposed to be opposite to the first side surface 1410. The second side surface 1420 of the cover member 1400 may be disposed along an edge E1 of the first substrate 1212. In this case, the edge E1 of the first substrate 1212 may be an edge disposed in the second region A2 among the four edges of the first substrate 1212 and provided in a direction parallel to the direction in which the plurality of connectors 210 and 220 is disposed. As described above, when the second side surface 1420 of the cover member 1400 is disposed along the edge E1 of the first substrate 1212, the cover member 1400 may press the edge E1 of the first substrate 1212, which makes it possible to prevent the edge of the thermoelectric module 1200 from being lifted off the fluid flow part 1100. In this case, a first groove 1412 may be concavely formed in the first side surface 1410 of the cover member 1400 and directed toward the second side surface 1420, and a second groove 1422 may be concavely formed in the second side surface 1420 and directed toward the first side surface 1410. As described above, in case that the grooves are formed in both the first side surface 1410 and the second side surface 1420 of the cover member 1400, thermal stress may be applied to the two opposite surfaces of the cover member 1400 in a balanced manner, which makes it possible to prevent the cover member 1400 from being distorted by an imbalance of thermal stress. In this case, a width B1 of the first groove 1412 is larger than a width B2 of the second groove 1422. For example, the width B1 of the first groove 1412 may be 1.5 to 3 times the width B2 of the second groove 1422. As described above, in case that the width B1 of the first groove 1412 is larger than the width B2 of the second groove 1422, electric wires W1 and W2 may be easily connected to the connector parts 210 and 220. Furthermore, when the width B1 of the first groove 1412 disposed to be close to the connector parts 210 and 220 is larger than the width B2 of the second groove 1422, the heat generated from the connector parts 210 and 220 may be efficiently discharged through the first groove 1412, and the second side surface 1420 may maintain the rigidity of the cover member 1400. In addition, when a width of the second groove 1422 disposed to be close to the edge E1 of the first substrate 1212 is smaller than a width of the first groove 1412, a contact area between the cover member 1400 and the edge E1 of the first substrate 1212 is increased at the edge E1 of the first substrate 1212, such that a force applied to the edge E1 of the first substrate 1212 by the cover member 1400 is increased. Therefore, it is possible to increase a joining force between the fluid flow part 1100 and the edge E1 of the first substrate 1212 of the thermoelectric module 1200 and to prevent the fluid flow part 1100 from being lifted off the edge E1 of the first substrate 1212 of the thermoelectric module 1200.

Specifically, the cover member 1400 may be disposed on at least a part of the connector part 210 and at least a part of the connector part 220. As described above, in case that the connector parts 210 and 220 include a first connector 210 and a second connector 220 disposed to be spaced apart from each other, at least a part of the first connector 210 and at least a part of the second connector 220 may be exposed through the first groove 1412. According to this configuration, the electric wires W1 and W2 may be easily connected to one end or the other end of the first connector 210 exposed through the first groove 1412 and one end or the other end of the second connector 220 exposed through the first groove 1412. That is, because the electric wires W1 and W2 may be connected after the cover member 1400 is fixed to the first substrate 1212 of the thermoelectric module 1200, the electric wires W1 and W2 may be replaced or connection routes for the electric wires W1 and W2 may be changed.

In this case, because the connector parts 210 and 220 include the first and second connectors 210 and 220 disposed to be spaced apart from each other at the same distance h2 from the edge E1 of the first substrate 1212, the cover member 1400 may include a first cover region 1430 disposed on at least a part of the first connector 210 and a second cover region 1432 disposed on at least a part of the second connector 220, and the first groove 1412 may be disposed between the first cover region 1430 and the second cover region 4320.

In this case, as illustrated in FIG. 13, a distal end of the first connector 210 and a distal end of the second connector 220 may be disposed to be exposed from a lateral side of the first cover region 1430 and a lateral side of the second cover region 1432. For example, a width C1 of each of the first and second cover regions 1430 and 1432 may be 0.8 to 0.95 times, particularly, 0.85 to 0.9 times a width C2 of each of the first and second connectors 210 and 220. According to this configuration, the first and second cover regions 1430 and 1432 may protect the first and second connectors 210 and 220 and facilitate the connection of the electric wires W1 and W2.

However, in case that the electric wires W1 and W2 are easily connected, the width C1 of each of the first and second cover regions 1430 and 1432 may be 0.8 to 1.1 times the width C2 of each of the first and second connectors 210 and 220. According to this configuration, the first and second cover regions 1430 and 1432 may respectively protect the first and second connectors 210 and 220 from an outside temperature or the like and to more effectively prevent damage caused by warping due to a temperature difference applied to and/or generated in the thermoelectric module.

In this case, one of two opposite surfaces of the first cover region 1430, which is disposed to be directed toward the connector 210, and one of two opposite surfaces of the second cover region 1432, which is disposed to be directed toward the connector 220, may be respectively disposed to be spaced apart from the connectors 210 and 220. According to this configuration, the first and second cover regions 1430 and 1432 may protect the connectors 210 and 220 from outside physical pressure, moisture, the second fluid, or contaminants. The first and second cover regions 1430 and 1432 may inhibit the connectors 210 and 220 from being in contact with a shield member made of a metallic material, which makes it possible to increase voltage resistance of the thermoelectric module 1200.

Meanwhile, distal ends of the first and second cover regions 1430 and 1432 may be bent to be directed toward the first substrate 1212. That is, the cover member 1400 may further include first and second guide regions 1440 and 1442 protruding from the first and second cover regions 1430 and 1432 toward the first substrate 1212. The first guide region 1440 may be disposed on a side surface of the first connector 210, and the second guide region 1442 may be disposed on a side surface of the second connector 220. According to this configuration, it is possible to prevent the electric wires W1 and W2 connected to the first to second connectors 210 and 220 from being pushed and moved upward toward the electrode of the thermoelectric element or separated. In this case, the first to second guide regions 1440 and 1442 may be in contact with the first substrate 1212. According to this configuration, a pressure may be applied to the first substrate 1212 by the first to second guide regions 1440 and 1442, which makes it possible to increase a joining force between the first substrate 1212 and the fluid flow part 1100. As described above, the first cover region 1430 may be connected to the first guide region 1440, and the second cover region 1432 may be connected to the second guide region 1442. In this case, the first and second cover regions 1430 and 1432 may respectively support the first and second guide regions 1440 and 1442. When the width C1 of each of the first and second cover regions 1430 and 1432 is within a predetermined range, e.g., 0.85 or more times the width C2 of each of the first and second connectors 210 and 220, the cover member 1400 may have high rigidity to the extent that the cover member 1400 may support the first and second guide regions 1440 and 1442.

In addition, according to the embodiment of the present invention, the first surface 1402 of the two opposite surfaces of the coupling part 1400A, which is disposed to be directed toward the first substrate 1212 on the coupling part 1400A of the cover member 1400, may be in contact with the first substrate 1212. A plurality of recesses R1 may be formed in the first surface 1402 and disposed at uniform intervals. According to this configuration, injection molding of the cover member 1400 may be easily performed, warping caused by thermal deformation may be prevented, the amount of materials and the weight of the cover member 1400, which are required to form the cover member 1400, may be reduced, and the first substrate 1212 may be uniformly pressed on the entire area of the cover member 1400.

Meanwhile, according to the embodiment of the present invention, the second groove 1422 of the cover member 1400 may include a curved surface having a predetermined curvature. A third groove G may be formed at the edge E1 of the first substrate 1212, and the second groove 1422 and the third groove G may be disposed to correspond to each other. That is, the second groove 1422 and the third groove G may have the same size and shape and aligned on the same position on the first surface 1110 of the fluid flow part 1100. According to this configuration, the position of the cover member 1400 is easily guided when the cover member 1400 is disposed after the thermoelectric module 1200 is disposed on the fluid flow part 1100.

In addition, the second groove 1422 of the cover member 1400 and the third groove G formed at the edge E1 of the first substrate 1212 may mitigate thermal stress of the first substrate 1212, which makes it possible to reduce the thermal deformation of the first substrate 1212 and thus increase the joining force between the first substrate 1212 and the fluid flow part 1100.

In particular, at least one of the second groove 1422 and the third groove G may have a gradually curved shape having a predetermined curvature. As described above, it is possible to prevent thermal stress from being concentrated on the edge portion and thus further improve the performance in mitigating the thermal stress of the first substrate 1212.

In this case, the second groove 1422 may be formed between the plurality of second-third through-holes S23 formed at the two opposite sides of the cover member 1400, and the third groove G may be formed between the first and second connectors 210 and 220 disposed in the second region A2 of the first substrate 1212. In this case, a depth h1 of the third groove G may be smaller than a distance h2 from the edge E1 of the first substrate 1212 to the connectors 210 and 220. According to this configuration, it is possible to maintain the joining force between the first substrate 1212 and the fluid flow part 1100 and improve voltage resistance performance of the thermoelectric module 1200.

From the foregoing, the description is focused on the cover member 1400 and the single thermoelectric module 1200 disposed on the fluid flow part 1100. However, as illustrated in FIGS. 10 to 12, the plurality of thermoelectric modules 1200 may be disposed on one surface of the fluid flow part 1100, and the cover member 1400 may be disposed for each of the thermoelectric modules 1200.

Throughout the present specification, the thermoelectric element 100 or 1210 has been described as including the first substrate 110, the first electrode 120, the P-type thermoelectric leg 130, the N-type thermoelectric leg 140, the second electrode 150, and the second substrate 160, but the definition of the thermoelectric element 100 or 1210 is not limited thereto. The thermoelectric element 100 or 1210 may be meant as including the first electrode 120, the P-type thermoelectric leg 130, the N-type thermoelectric leg 140, the second electrode 150, and the second substrate 160 and being disposed on the first substrate 110.

In addition, throughout the present specification, the power generation apparatus 1000 has been described as including the fluid flow part 1100, the thermoelectric module 1200, and the cover member 1400, and the thermoelectric module 1200 has been described as including the thermoelectric element 1210 and the heat sink 1220, but the present invention is not limited thereto. The thermoelectric module may be meant as including all the fluid flow part 1100, the thermoelectric element 1210, the heat sink 1220, and the cover member 1400.

In the present specification, the width may mean a width in a direction in which the plurality of thermoelectric modules is arrayed, i.e., a width in the first direction illustrated in FIGS. 8 to 13. For example, the width D of the cover member 1400, the width D' of the first substrate 1212, the width B1 of the first groove 1412, the width B2 of the second groove 1422, the width C1 of each of the first and second cover regions 1430 and 1432, and the width C2 of each of the first and second connectors 210 and 220 may each mean a width in a direction in which the plurality of thermoelectric modules is arrayed, i.e., a width in the first direction illustrated in FIGS. 8 to 13.

FIG. 15 is a perspective view illustrating a plate according to the embodiment of the present invention. FIG. 15 is a perspective view illustrating the first and second plates among the plurality of plates included in the chamber.

The chamber according to the embodiment of the present invention may include the plurality of plates. The plurality of plates may include the first and second plates 2100 and 2300. The first plate 2100 may be disposed at a front side of the chamber, and the second plate 2300 may be disposed at a rear side of the chamber. Based on the power generation apparatus according to the embodiment of the present invention, the front side of the chamber may mean a side in a direction in which the junction box is disposed, and the rear side of the chamber may mean a side in a direction opposite to the front side. Therefore, the first and second plates 2100 and 2300 may be disposed to face each other.

The first plate 2100 may include coupling parts 2110. The coupling part 2110 may include a first hole 2120 and recesses 2130.

The first hole 2120 may have a shape elongated in one direction. For example, the first hole 2120 may have a rod shape formed from the upper side toward the lower side of the chamber. The first hole 2120 may be formed through the first plate 2100 from the first surface to the second surface of the first plate 2100. The first hole 2120 may be formed through the first plate 2100 from the second surface to the first surface of the first plate 2100. The first surface of the first plate 2100 may mean an outer side of the chamber, and the second surface of the first plate 2100 may mean an inner side of the chamber.

The recesses 2130 may be disposed along an edge of the first hole 2120. The recesses 2130 may include first and second recesses. The first recess may be disposed in the first surface of the first plate 2100 and formed along the edge of the first hole 2120. The second recess may be disposed in the second surface of the first plate 2100 and formed along the edge of the first hole 2120. That is, the first recess may be disposed at the outer side of the chamber, and the second recess may be disposed at the inner side of the chamber.

The power generation apparatus may be inserted into the first hole 2120. A part of the power generation apparatus may be inserted into the first hole 2120. The first hole 2120 may be provided as a plurality of first holes 2120. The plurality of first holes 2120 may be disposed to be spaced apart from one another at predetermined intervals.

The first plate 2100 may include second holes 2140 and third holes 2160.

The second hole 2140 may have, but not limited to, a circular shape. The second hole 2140 may be formed through the first plate 2100 from the first surface to the second surface of the first plate 2100. The second hole 2140 may be formed through the first plate 2100 from the second surface to the first surface of the first plate 2100. The first surface of the first plate 2100 may mean the outer side of the chamber, and the second surface of the first plate 2100 may mean the inner side of the chamber. The pipe included in the guide member may be inserted into the second hole 2140. The second hole 2140 may be provided as a plurality of second holes 2140. The plurality of second holes 2140 may be disposed to be spaced apart from one another at predetermined intervals.

The third hole 2160 may have, but not limited to, a circular shape. The third hole 2160 may be formed through the first plate 2100 from the first surface to the second surface of the first plate 2100. The third hole 2160 may be formed through the first plate 2100 from the second surface to the first surface of the first plate 2100. The first surface of the first plate 2100 may mean the outer side of the chamber, and the second surface of the first plate 2100 may mean the inner side of the chamber. A screw, which couples the channel cover, the chamber, and the guide member, may be inserted into the third hole 2160. The third hole 2160 may be provided as a plurality of third holes 2160. The plurality of third holes 2160 may be disposed to be spaced apart from one another at predetermined intervals.

The second plate 2300 may include coupling parts 2310. The coupling part 2310 may include a first hole 2320 and recesses 2320. The coupling part 2310 may include the first hole 2320 and the recesses 2320.

The coupling part 2310 may include the first hole 2320. The first hole 2320 may have a shape elongated in one direction. For example, the first hole 2320 may have a rod shape formed from the upper side toward the lower side of the chamber. The first hole 2320 may be formed through the second plate 2300 from the first surface to the second surface of the second plate 2300. The first hole 2320 may be formed through the second plate 2300 from the second surface to the first surface of the second plate 2300. The first surface of the second plate 2300 may mean the outer side of the chamber, and the second surface of the second plate 2300 may mean the inner side of the chamber.

The recesses 2320 may be disposed along an edge of the first hole 2320. The recesses 2320 may include first and second recesses. The first recess may be disposed in the first surface of the first plate 2100 and formed along the edge of the first hole 2320. The second recess may be disposed in the second surface of the first plate 2100 and formed along the edge of the first hole 2320. That is, the first recess may be disposed at the outer side of the chamber, and the second recess may be disposed at the inner side of the chamber.

The power generation apparatus may be inserted into the first hole 2320. A part of the power generation apparatus may be inserted into the first hole 2320. The first hole 2320 may be provided as a plurality of first holes 2320. The plurality of first holes 2320 may be disposed to be spaced apart from one another at predetermined intervals.

The first hole 2320 of the second plate 2300 may be disposed to face the first hole 2120 of the first plate 2100. The plurality of first holes 2320 disposed in the second plate 2300 may be disposed to face the plurality of first holes 2120 disposed in the first plate 2100.

The coupling part according to the embodiment of the present invention will be described in detail with reference to FIGS. 16 to 18.

FIG. 16 is a perspective view illustrating the coupling part according to the embodiment of the present invention, FIG. 17 is a partial cross-sectional view taken in a first direction A-A' and illustrating the coupling part, and FIG. 18 is a partial cross-sectional view taken in a second direction B-B' and illustrating the coupling part.

In case that the first plate 2100 illustrated in FIG. 16 is cut in the first direction A-A', the coupling part is as illustrated in FIG. 17. In this case, the first direction A-A' may be a direction parallel to a lower-end side of the chamber. The first direction A-A' may be a direction parallel to a lower-end side of the power generation system.

The coupling part 2110 will be described with reference to FIG. 17 illustrating the first plate 2100 cut in the first direction A-A'. A region of the coupling part 2110 may be divided into a first region 2111, a second region 2112, and a third region 2113.

The first hole 2120 and a first recess 2131 may be disposed in the first region 2111. The first recess 2131 may be disposed along a side surface of the first hole 2120 in the first region 2111. The first recess 2131 may have a predetermined shape. FIG. 17 illustrates that the first recess 2131 has a shape having a straight surface, but the present invention is not limited thereto. The first recess 2131 may have a shape having a curved surface. Furthermore, the first recess 2131 may have a concave-convex shape. The first region 2111 may include a first opening open1 having a first width w1 in the first direction A-A', and a second opening open2 having a second width w2 in the first direction A-A'. The first opening open1 may be disposed in the first surface of the first plate 2100. The first opening open1 may be disposed in an outer surface of the first plate 2100. The first opening open1 and the second opening open2 may communicate with each other.

The first hole 2120 may be disposed in the second region 2112. The second region 2112 may include the second opening open2 having the second width w2 in the first direction A-A', and a third opening open3 having the second width w2 in the first direction A-A'. The second opening open2 included in the second region 2112 may be the second opening open2 included in the first region 2111. Therefore, the second region 2112 may extend from the first region 2111. The second opening open2 and the third opening open3 may communicate with each other.

The first hole 2120 and a second recess 2132 may be disposed in the third region 2113. The second recess 2132 may be disposed along the side surface of the first hole 2120 in the third region 2113. The second recess 2132 may have a predetermined shape. FIG. 17 illustrates that the second recess 2132 has a shape having a straight surface, but the present invention is not limited thereto. The second recess 2132 may have a shape having a curved surface. Furthermore, the second recess 2132 may have a concave-convex shape. The third region 2113 may include the third opening open3 having the second width w2 in the first direction A-A', and a fourth opening open4 having the first width w1 in the first direction A-A'. The third opening open3 included in the third region 2113 may be the third opening open3 included in the second region 2112. Therefore, the third region 2113 may extend from the second region 2112. The fourth opening open4 may be disposed in the second surface of the first plate 2100. The second surface of the first plate 2100 may be a surface opposite to the first surface of the first plate 2100. The fourth opening open4 may be disposed in an inner surface of the first plate 2100. The third opening open3 and the fourth opening open4 may communicate with each other.

An average width of the first region 2111 in the first direction A-A' may be larger than an average width of the second region 2112 in the first direction A-A'. The average width of the second region 2112 in the first direction A-A' may be smaller than the average width of the first region 2111 in the first direction A-A'. An average width of the third region 2113 in the first direction A-A' may be larger than the average width of the second region 2112 in the first direction A-A'. The average width of the second region 2112 in the first direction A-A' may be smaller than the average width of the third region 2113 in the first direction A-A'.

A sidewall surrounding the first region 2111 may have an inclination in a direction from the first opening open1 toward the second opening open2. The inclination may have, but not limited to, a shape having a straight surface. The inclination may have a shape having a curved surface. A width of the first region 2111 in the first direction A-A' may decrease in the direction from the first opening open1 toward the second opening open2. A sidewall surrounding the third region 2113 may have an inclination in a direction from the fourth opening open4 toward the third opening open3. A width of the third region 2113 in the first direction A-A' may decrease in the direction from the fourth opening open4 toward the third opening open3.

The coupling part will be described with reference to FIG. 18 illustrating the first plate 2100 cut in the second direction B-B'. The region of the coupling part may be divided into the first region 2111, the second region 2112, and the third region 2113.

The first hole 2120 and the first recess 2131 may be disposed in the first region 2111. The first recess 2131 may be disposed along the side surface of the first hole 2120 in the first region 2111. The first recess 2131 may have a predetermined shape. FIG. 18 illustrates that the first recess 2131 has a shape having a straight surface, but the present invention is not limited thereto. The first recess 2131 may have a shape having a curved surface. Furthermore, the first recess 2131 may have a concave-convex shape. The first region 2111 may include the first opening open1 having a third width w3 in the second direction B-B', and the second opening open2 having a fourth width w4 in the second direction B-B'. The first opening open1 may be disposed in the first surface of the first plate 2100. The first opening open1 may be disposed in the outer surface of the first plate 2100. The first opening open1 and the second opening open2 may communicate with each other.

The first hole 2120 may be disposed in the second region 2112. The second region 2112 may include the second opening open2 having the fourth width w4 in the second direction B-B', and the third opening open3 having the fourth width w4 in the second direction B-B'. The second opening open2 included in the second region 2112 may be the second opening open2 included in the first region 2111. Therefore, the second region 2112 may extend from the first region 2111. The second opening open2 and the third opening open3 may communicate with each other.

The first hole 2120 and the second recess 2132 may be disposed in the third region 2113. The second recess 2132 may be disposed along the side surface of the first hole 2120 in the third region 2113. The second recess 2132 may have a predetermined shape. FIG. 18 illustrates that the second recess 2132 has a shape having a straight surface, but the present invention is not limited thereto. The second recess 2132 may have a shape having a curved surface. Furthermore, the second recess 2132 may have a concave-convex shape. The third region 2113 may include the third opening open3 having the fourth width w4 in the second direction B-B', and the fourth opening open4 having the third width w3 in the second direction B-B'. The third opening open3 included in the third region 2113 may be the third opening open3 included in the second region 2112. Therefore, the third region 2113 may extend from the second region 2112. The fourth opening open4 may be disposed in the second surface of the first plate 2100. The second surface of the first plate 2100 may be a surface opposite to the first surface of the first plate 2100. The first opening open1 may be disposed in the inner surface of the first plate 2100. The third opening open3 and the fourth opening open4 may communicate with each other.

An average width of the first region 2111 in the second direction B-B' may be larger than an average width of the second region 2112 in the second direction B-B'. The average width of the second region 2112 in the second direction B-B' may be smaller than the average width of the first region 2111 in the second direction B-B'. An average width of the third region 2113 in the second direction B-B' may be larger than the average width of the second region 2112 in the second direction B-B'. The average width of the second region 2112 in the second direction B-B' may be smaller than the average width of the third region 2113 in the second direction B-B'.

The sidewall surrounding the first region 2111 may have an inclination in the direction from the first opening open1 toward the second opening open2. A width of the first region 2111 in the second direction B-B' may decrease in the direction from the first opening open1 toward the second opening open2. The sidewall surrounding the third region 2113 may have an inclination in the direction from the fourth opening open4 toward the third opening open3. A width of the third region 2113 in the second direction B-B' may decrease in the direction from the fourth opening open4 toward the third opening open3.

Because the second plate may be identical in configuration to the above-mentioned first plate, a repeated description of the second plate will be omitted.

A configuration in which the coupling part and the power generation apparatus are coupled will be described with reference to FIGS. 19 to 21.

FIG. 19 is a partial perspective view of the first plate and the power generation apparatus according to the embodiment of the present invention, FIG. 20 is a partial cross-sectional view taken in the first direction A-A' and illustrating the first plate and the power generation apparatus, and FIG. 21 is a partial cross-sectional view taken in the second direction B-B' and illustrating the first plate and the power generation apparatus.

As illustrated in FIG. 19, in case that the power generation apparatus 1000 is cut in the first direction A-A' in a state in which a part of the power generation apparatus 1000 is inserted into the first hole 2120 of the first plate 2100, the coupling part and the power generation apparatus 1000 may be as illustrated in FIG. 20. In this case, the first direction A-A' may be the direction parallel to the lower-end side of the chamber. The first direction A-A' may be the direction parallel to the lower-end side of the power generation system.

Referring to FIG. 20, in case that the first plate 2100 is cut in the first direction A-A', the region of the coupling part may be divided into the first region 2111, the second region 2112, and the third region 2113. A part of the power generation apparatus 1000 may be disposed in the first region 2111, the second region 2112, and the third region 2113 of the coupling part. Specifically, a part of the fluid flow part 1100 included in the power generation apparatus 1000 may be disposed in the first region 2111, the second region 2112, and the third region 2113 of the coupling part. The thermoelectric module 1200 included in the power generation apparatus 1000 may not be inserted into the coupling part.

The first region 2111 may include the first opening open1 having the first width w1 in the first direction A-A', and the second opening open2 having the second width w2 in the first direction A-A'. The first opening open1 and the second opening open2 may communicate with each other. The power generation apparatus 1000 may be disposed in the first region 2111. Because the power generation apparatus 1000 is inserted into the first hole 2120 of the first plate 2100, a width of the power generation apparatus 1000 in the first direction A-A' may be equal to the second width w2 of the second opening open2.

Because the first width w1 of the first opening open1 and the second width w2 of the second opening open2 are different from each other, the sidewall surrounding the first region 2111 may have the inclination in the direction from the first opening open1 toward the second opening open2. The width of the first region 2111 in the first direction A-A' may decrease in the direction from the first opening open1 toward the second opening open2. Therefore, empty spaces may be defined in the first recess a1 and a2 even though the power generation apparatus 1000 is disposed in the first region 2111 of the first hole 2120.

The second region 2112 may include the second opening open2 having the second width w2 in the first direction A-A', and the third opening open3 having the second width w2 in the first direction A-A'. The second opening open2 included in the second region 2112 may be the first opening open1 included in the first region 2111. Therefore, the second region 2112 may extend from the first region 2111. The second opening open2 and the third opening open3 may communicate with each other. According to the embodiment, the width of the power generation apparatus 1000 in the first direction A-A' may be equal to the second width w2 of the second opening open2 and the second width w2 of the third opening open3, and the sidewall of the second region 2112 may have no inclination. Therefore, unlike the first region 2111, no groove may be formed between the power generation apparatus 1000 and the sidewall in the second region 2112.

The third region 2113 may include the third opening open3 having the second width w2 in the first direction A-A', and the fourth opening open4 having the first width w1 in the first direction A-A'. The third opening open3 included in the third region 2113 may be the third opening open3 included in the second region 2112. Therefore, the third region 2113 may extend from the second region 2112. The third opening open3 and the fourth opening open4 may communicate with each other.

Because the first width w1 of the fourth opening open4 and the second width w2 of the third opening open3 are different from each other, the sidewall surrounding the third region 2113 may have the inclination in the direction from the fourth opening open4 toward the third opening open3. The width of the third region 2113 in the first direction A-A' may decrease in the direction from the fourth opening open4 toward the third opening open3. Therefore, empty spaces may be defined in the second recess b1 and b2 in the third region 2113 even though the power generation apparatus 1000 is disposed in the third region 2113 of the first hole 2120.

As illustrated in FIG. 21, in case that the power generation apparatus 1000 is cut in the second direction B-B' in a state in which a part of the power generation apparatus 1000 is inserted into the first hole 2120 of the first plate 2100, the first plate 2100 and the power generation apparatus 1000 may be as illustrated in FIG. 21. In this case, the second direction B-B' may be a direction perpendicular to the first direction A-A'.

Referring to FIG. 21, in case that the first plate 2100 is cut in the second direction B-B', the region of the coupling part may be divided into the first region 2111, the second region 2112, and the third region 2113. A part of the power generation apparatus 1000 may be disposed in the first region 2111, the second region 2112, and the third region 2113 of the coupling part. Specifically, a part of the fluid flow part 1100 included in the power generation apparatus 1000 may be disposed in the first region 2111, the second region 2112, and the third region 2113 of the coupling part.

The first region 2111 may include the first opening open1 having the third width w3 in the second direction B-B', and the second opening open2 having the fourth width w4 in the second direction B-B'. The first opening open1 and the second opening open2 may communicate with each other. The power generation apparatus 1000 may be disposed in the first region 2111. Because the power generation apparatus 1000 is inserted into the first hole 2120 of the coupling part, the width of the power generation apparatus 1000 in the second direction B-B' may be equal to the fourth width w4 of the second opening open2.

Because the third width w3 of the first opening open1 and the fourth width w4 of the second opening open2 are different from each other, the sidewall surrounding the first region 2111 may have the inclination in the direction from the first opening open1 toward the second opening open2. The width of the first region 2111 in the second direction B-B' may decrease in the direction from the first opening open1 toward the second opening open2. Therefore, empty spaces may be defined in the first recess c1 and c2 between the power generation apparatus 1000 and the sidewall of the first region 2111 based on the second direction B-B' even though the power generation apparatus 1000 is disposed in the first region 2111 of the coupling part.

The second region 2112 may include the second opening open2 having the fourth width w4 in the second direction B-B', and the third opening open3 having the fourth width w4 in the second direction B-B'. The second opening open2 included in the second region 2112 may be the first opening open1 included in the first region 2111. Therefore, the second region 2112 may extend from the first region 2111. The second opening open2 and the third opening open3 may communicate with each other. According to the embodiment, the width of the power generation apparatus 1000 in the second direction B-B' may be equal to the fourth width w4 of the second opening open2 and the third width w3 of the third opening open3, and the sidewall of the second region 2112 may have no inclination. Therefore, unlike the first region 2111, no groove may be formed between the power generation apparatus 1000 and the sidewall of the second region 2112.

The third region 2113 may include the third opening open3 having the fourth width w4 in the second direction B-B', and the fourth opening open4 having the third width w3 in the second direction B-B'. The third opening open3 included in the third region 2113 may be the third opening open3 included in the second region 2112. Therefore, the third region 2113 may extend from the second region 2112. The third opening open3 and the fourth opening open4 may communicate with each other.

Because the third width w3 of the fourth opening open4 and the fourth width w4 of the third opening open3 are different from each other, the sidewall surrounding the third region 2113 may have the inclination in the direction from the fourth opening open4 toward the third opening open3. The width of the third region 2113 in the second direction B-B' may decrease in the direction from the fourth opening open4 toward the third opening open3. Therefore, empty spaces may be defined in the second recess d1 and d2 between the power generation apparatus 1000 and the sidewall of the third region 2113 even though the power generation apparatus 1000 is disposed in the third region 2113 of the coupling part.

Because the second plate may be identical in configuration to the above-mentioned first plate, a repeated description of the second plate will be omitted.

A configuration in which the first plate, the power generation apparatus, and the welding bead are coupled will be described with reference to FIGS. 22 to 24.

FIG. 22 is a partial perspective view illustrating the first plate, the power generation apparatus, and the welding bead according to the embodiment of the present invention, FIG. 23 is a partial cross-sectional view taken in the first direction A-A' and illustrating the first plate, the power generation apparatus, and the welding bead, and FIG. 24 is a partial cross-sectional view taken in the second direction B-B' and illustrating the first plate, the power generation apparatus, and the welding bead.

As illustrated in FIG. 22, in case that the power generation apparatus 1000 is cut in the first direction A-A' in the state in which a part of the power generation apparatus 1000 is inserted into the first hole 2120 of the first plate 2100, the first plate 2100 and the power generation apparatus 1000 may be as illustrated in FIG. 23. In this case, the first direction A-A' may be the direction parallel to the lower-end side of the chamber. The first direction A-A' may be a direction parallel to a lower-end side of the power generation apparatus.

Referring to FIG. 23, in case that the first plate 2100 is cut in the first direction A-A', the region of the coupling part may be divided into the first region 2111, the second region 2112, and the third region 2113. A part of the power generation apparatus 1000 may be disposed in the first region 2111, the second region 2112, and the third region 2113 of the coupling part. Specifically, a part of the fluid flow part 1100 included in the power generation apparatus 1000 may be disposed in the first region 2111, the second region 2112, and the third region 2113 of the coupling part. The thermoelectric module 1200 included in the power generation apparatus 1000 may not be inserted into the first hole 2120.

The first region 2111 may include the first opening open1 having the first width w1 in the first direction A-A', and the second opening open2 having the second width w2 in the first direction A-A'. The first opening open1 and the second opening open2 may communicate with each other. The power generation apparatus 1000 may be disposed in the first region 2111. Because the power generation apparatus 1000 is inserted into the first hole 2120 of the first plate 2100, the width of the power generation apparatus 1000 in the first direction A-A' may be equal to the second width w2 of the second opening open2.

Because the first width w1 of the first opening open1 and the second width w2 of the second opening open2 are different from each other, the sidewall surrounding the first region 2111 may have the inclination in the direction from the first opening open1 toward the second opening open2. The width of the first region 2111 in the first direction A-A' may decrease in the direction from the first opening open1 toward the second opening open2.

A first welding bead 2200 may be disposed in the first recess between the power generation apparatus 1000 and the sidewall of the first region 2111. Therefore, the first welding bead 2200 may be disposed to surround a side surface of the duct. Because the first welding bead 2200 is disposed in the groove formed between the power generation apparatus 1000 and the sidewall of the first region 2111, and a contact area between the first welding bead 2200, the first plate 2100, and the power generation apparatus 1000 may increase. Therefore, a coupling force between the first plate 2100 and the power generation apparatus 1000 may increase, and sealability between the inside and outside of the chamber may be improved. According to the embodiment, the first welding bead 2200 may be disposed to protrude from the outer side of the chamber. Specifically, the first welding bead 2200 may be disposed in the first recess and protrude to the outside of the first recess. According to another embodiment, the first welding bead 2200 may be disposed so as not to protrude based on the outer side of the chamber. Specifically, the first welding bead 2200 may be disposed so as not to protrude to the outside of the first recess. That is, the first welding bead 2200 may be disposed only in the first recess.

The second region 2112 may include the second opening open2 having the second width w2 in the first direction A-A', and the third opening open3 having the second width w2 in the first direction A-A'. The second opening open2 included in the second region 2112 may be the first opening open1 included in the first region 2111. Therefore, the second region 2112 may extend from the first region 2111. The second opening open2 and the third opening open3 may communicate with each other. According to the embodiment, the width of the power generation apparatus 1000 in the first direction A-A' may be equal to the second width w2 of the second opening open2 and the second width w2 of the third opening open3, and the sidewall of the second region 2112 may have no inclination. Therefore, unlike the first region 2111, no groove may be formed between the power generation apparatus 1000 and the sidewall in the second region 2112.

The third region 2113 may include the third opening open3 having the second width w2 in the first direction A-A', and the fourth opening open4 having the first width w1 in the first direction A-A'. The third opening open3 included in the third region 2113 may be the third opening open3 included in the second region 2112. Therefore, the third region 2113 may extend from the second region 2112. The third opening open3 and the fourth opening open4 may communicate with each other.

Because the first width w1 of the fourth opening open4 and the second width w2 of the third opening open3 are different from each other, the sidewall surrounding the third region 2113 may have the inclination in the direction from the fourth opening open4 toward the third opening open3. The width of the third region 2113 in the first direction A-A' may decrease in the direction from the fourth opening open4 toward the third opening open3. According to the embodiment, unlike the first recess, the first welding bead 2200 may not be disposed in the third recess b1 and b2. However, the present invention is not limited thereto. According to another embodiment, the first welding bead 2200 may also be disposed in the second recess b1 and b2. For example, in case that a predetermined interval is defined between the sidewall of the first plate and the side surface of the duct in the second region 2112, the first welding bead 2200 may also be disposed in the second recess through the predetermined interval during a process in which the first welding bead 2200 is disposed in the first recess.

As illustrated in FIG. 22, in case that the power generation apparatus 1000 is cut in the second direction B-B' in a state in which a part of the power generation apparatus 1000 is inserted into the first hole 2120 of the first plate 2100, the first plate 2100 and the power generation apparatus 1000 may be as illustrated in FIG. 24. In this case, the second direction B-B' may be the direction perpendicular to the first direction A-A'.

Referring to FIG. 24, in case that the first plate 2100 is cut in the second direction B-B', the region of the coupling part may be divided into the first region 2111, the second region 2112, and the third region 2113. A part of the power generation apparatus 1000 may be disposed in the first region 2111, the second region 2112, and the third region 2113 of the coupling part. Specifically, a part of the fluid flow part 1100 included in the power generation apparatus 1000 may be disposed in the first region 2111, the second region 2112, and the third region 2113 of the coupling part. The thermoelectric module 1200 included in the power generation apparatus 1000 may not be inserted into the first hole 2120.

The first region 2111 may include the first opening open1 having the third width w3 in the second direction B-B', and the second opening open2 having the fourth width w4 in the second direction B-B'. The first opening open1 and the second opening open2 may communicate with each other. The power generation apparatus 1000 may be disposed in the first region 2111. Because the power generation apparatus 1000 is inserted into the first hole 2120 of the coupling part, the width of the power generation apparatus 1000 in the second direction B-B' may be equal to the fourth width w4 of the second opening open2.

Because the third width w3 of the first opening open1 and the fourth width w4 of the second opening open2 are different from each other, the sidewall surrounding the first region 2111 may have the inclination in the direction from the first opening open1 toward the second opening open2. The width of the first region 2111 in the second direction B-B' may decrease in the direction from the first opening open1 toward the second opening open2. Therefore, the groove may be formed between the power generation apparatus 1000 and the sidewall of the first region 2111 based on the second direction B-B' even though the power generation apparatus 1000 is disposed in the first region 2111 of the first hole 2120. The first welding bead 2200 may be disposed in the groove formed between the power generation apparatus 1000 and the sidewall of the first region 2111 based on the second direction B-B'. Because the welding bead 2200 is disposed in the first recess, the contact area between the first welding bead 2200, the first plate 2100, and the power generation apparatus 1000 may increase. Therefore, a coupling force between the first plate 2100 and the power generation apparatus 1000 may increase, and sealability between the inside and outside of the chamber may be improved. According to the embodiment, the first welding bead 2200 may be disposed to protrude from the outer side of the chamber. Specifically, the first welding bead 2200 may be disposed in the first recess and protrude to the outside of the first recess. According to another embodiment, the first welding bead 2200 may be disposed so as not to protrude based on the outer side of the chamber. Specifically, the first welding bead 2200 may be disposed so as not to protrude to the outside of the first recess. That is, the first welding bead 2200 may be disposed only in the first recess.

The second region 2112 may include the second opening open2 having the fourth width w4 in the second direction B-B', and the third opening open3 having the fourth width w4 in the second direction B-B'. The second opening open2 included in the second region 2112 may be the first opening open1 included in the first region 2111. Therefore, the second region 2112 may extend from the first region 2111. The second opening open2 and the third opening open3 may communicate with each other. According to the embodiment, the width of the power generation apparatus 1000 in the second direction B-B' may be equal to the fourth width w4 of the second opening open2 and the third width w3 of the third opening open3, and the sidewall of the second region 2112 may have no inclination. Therefore, unlike the first region 2111, no groove may be formed between the power generation apparatus 1000 and the sidewall of the second region 2112.

The third region 2113 may include the third opening open3 having the fourth width w4 in the second direction B-B', and the fourth opening open4 having the third width w3 in the second direction B-B'. The third opening open3 included in the third region 2113 may be the third opening open3 included in the second region 2112. Therefore, the third region 2113 may extend from the second region 2112. The third opening open3 and the fourth opening open4 may communicate with each other.

Because the third width w3 of the fourth opening open4 and the fourth width w4 of the third opening open3 are different from each other, the sidewall surrounding the third region 2113 may have the inclination in the direction from the fourth opening open4 toward the third opening open3. The width of the third region 2113 in the second direction B-B' may decrease in the direction from the fourth opening open4 toward the third opening open3. Unlike the first recess, the first welding bead 2200 may not be disposed in the second recess d1 and d2 formed between the sidewall of the third region 2113 and the power generation apparatus 1000. However, the present invention is not limited thereto. According to another embodiment, the first welding bead 2200 may also be disposed in the second recess b1 and b2. For example, in case that a predetermined interval is defined between the sidewall of the first plate and the side surface of the duct in the second region 2112, the first welding bead may also be disposed in the second recess through the predetermined interval during a process in which the first welding bead is disposed in the first recess.

Because the second plate may be identical in configuration to the above-mentioned first plate, a repeated description of the second plate will be omitted.

FIG. 25 is a view illustrating the fluid flow part according to the embodiment of the present invention, and FIG. 26 is a view for explaining that unit fluid flow parts are coupled.

Referring to FIG. 25, the fluid flow part 1100 according to the embodiment of the present invention may include a plurality of unit fluid flow parts. The plurality of unit fluid flow parts may be in contact with one surface of each of the adjacent unit fluid flow parts. For example, one surface of a first unit fluid flow part 1100-1 and one surface of a second unit fluid flow part 1100-2 may be in contact with each other, one surface of the second unit fluid flow part 1100-2 and one surface of a third unit fluid flow part 1100-3 may be in contact with each other, and one surface of the third unit fluid flow part 1100-3 and one surface of a fourth unit fluid flow part 1100-4 may be in contact with each other. The unit fluid flow part, which is disposed at an outermost periphery among the plurality of unit fluid flow parts, may be coupled to the coupling part of the chamber.

The plurality of unit fluid flow parts may each have a concave-convex shape implemented on one surface that is in contact with the adjacent unit fluid flow part. For example, the concave-convex shape may be implemented on one surface of the first unit fluid flow part 1100-1 that is coupled to the second unit fluid flow part 1100-2. The concave-convex shape may be implemented on a surface of the second unit fluid flow part 1100-2 that is coupled to the third unit fluid flow part 1100-3, and the concave-convex shape may be implemented on a surface of the second unit fluid flow part 1100-2 that is coupled to the first unit fluid flow part 1100-1.

The concave-convex shapes formed on the surfaces of the plurality of unit fluid flow parts may engage with one another so that the adjacent unit fluid flow parts may be coupled to one another. For example, the concave-convex shape of one surface of the first unit fluid flow part 1100-1 coupled to the second unit fluid flow part 1100-2 may be implemented to engage with the concave-convex shape of one surface of the second unit fluid flow part 1100-2 coupled to the first unit fluid flow part 1100-1. Therefore, the convenience and accuracy in assembling the unit fluid flow parts may be improved. Furthermore, a coupling force between the unit fluid flow parts may be improved.

According to the embodiment of the present invention, second welding beads 2220 may be disposed along connection parts formed between the surfaces of the plurality of unit fluid flow parts that are in contact with one another. The second welding bead 2220 may be disposed to surround the connection part between the unit fluid flow parts. For example, referring to FIG. 26, the second welding bead 2220 may be disposed along the connection part formed as the second unit fluid flow part 1100-2 and the third unit fluid flow part 1100-3 are coupled to each other. The second welding bead 2220 may be disposed on the connection part and the surface of the unit fluid flow part adjacent to the connection part. The second welding bead 2220 may be disposed along the connection part and extend to the surface of the unit fluid flow part adjacent to the connection part. The fluid in the fluid passage tube in the fluid flow part may leak to the outside of the fluid flow part because of a pressure even though the unit fluid flow parts are coupled to one another as the concave-convex shapes of the unit fluid flow parts engage with one another. Therefore, it is necessary to increase the coupling force between the connection parts between the unit fluid flow parts. According to the present invention, the second welding bead 2220 may surround the connection part, which makes it possible to solve the above-mentioned problem.

FIG. 27 is a top plan view illustrating the power generation apparatus according to the embodiment of the present invention.

As illustrated in FIG. 27, a plurality of thermoelectric elements 1201 to 1206 and a shield member 1500 may be disposed on one surface of the unit fluid flow part according to the embodiment of the present invention. The plurality of thermoelectric elements 1201 to 1206 and the shield member 1500 may be disposed on a front surface of the unit fluid flow part. The plurality of thermoelectric elements 1201 to 1206 and the shield member 1500 may be disposed on a rear surface of the unit fluid flow part. The shield member 1500 may have the same length as the unit fluid flow part. The shield member 1500 may have openings formed at positions corresponding to the plurality of thermoelectric elements 1201 to 1206 so that the plurality of thermoelectric elements 1201 to 1206 may be exposed.

The shield member 1500 may have a plurality of fastening holes. The fastening holes of the shield member 1500 may correspond to a plurality of fastening holes h1 to h7 disposed in one surface of the unit fluid flow part. That is, the plurality of fastening holes h1 to h7 may be respectively disposed in the front and rear surfaces of the unit fluid flow part. The shield member 1500 and the unit fluid flow part may be coupled to each other by screws that penetrate the plurality of fastening holes of the shield member 1500 and the plurality of fastening holes h1 to h7 of the unit fluid flow part.

The plurality of fastening holes h1 to h7 formed in the unit fluid flow part may be disposed at predetermined intervals. For example, a distance between a first fastening hole h1 and a second fastening hole h2 may be equal to a distance between the second fastening hole h2 and a third fastening hole h3.

A distance w6 between a first coupling surface of the unit fluid flow part and a fastening hole h1, which is closest to the first coupling surface among the plurality of fastening holes h1 to h7 disposed in the unit fluid flow part, may be smaller than an interval w5 between the plurality of fastening holes h1 to h7 (w6<w5). A distance w7 between a second coupling surface of the unit fluid flow part and a fastening hole h7, which is closest to the second coupling surface among the plurality of fastening holes h1 to h7 disposed in the unit fluid flow part, may be larger than the interval w5 between the plurality of fastening holes h1 to h7 (w7>w5). That is, the plurality of fastening holes h1 to h7 disposed in one surface of the unit fluid flow part may be asymmetrically disposed in a longitudinal direction of the unit fluid flow part. Because the plurality of fastening holes h1 to h7 disposed in one surface of the unit fluid flow part is asymmetrically disposed in the longitudinal direction of the unit fluid flow part as described above, the plurality of fastening holes h1 to h7 disposed in the front and rear surfaces of the unit fluid flow part may also be asymmetrically disposed. Therefore, a coupling force between the shield member 1500 and the unit fluid flow part may increase even though a thickness of the unit fluid flow part is small.

The power generation system may generate electric power by using heat generated from a ship, vehicle, a power station, terrestrial heat, or the like. A plurality of power generation apparatuses may be arranged to efficiently collect heat. In this case, the power generation apparatuses may each improve the cooling performance of the low-temperature part of the thermoelectric element by improving the joining force between the thermoelectric module and the fluid flow part, such that the efficiency and reliability of the power generation apparatus may be improved, which makes it possible to improve fuel efficiency of a transporter such as a ship or a vehicle. Accordingly, it is possible to reduce transportation costs and establish environmental-friendly industrial environments in marine transport industries and transportation industries. It is possible to reduce material costs in case that the present invention is applied to manufacturing industries such as steel industries.

While the present invention has been described above with reference to the exemplary embodiments, it may be understood by those skilled in the art that the present invention may be variously modified and changed without departing from the spirit and scope of the present invention disclosed in the claims.

The invention claimed is:

1. A thermoelectric module comprising:
a substrate;
a thermoelectric element disposed on the substrate;
a connector part disposed on the substrate and electrically connected to the thermoelectric element; and
a cover member disposed on the connector part,
wherein the cover member comprises a first side surface adjacent to the thermoelectric element, and a second side surface opposite to the first side surface,
wherein the first side surface comprises a first groove concave toward the second side surface,
wherein the second side surface is disposed along an edge of the substrate and comprises a second groove concave toward the first side surface,
wherein a width of the first groove is larger than a width of the second groove,
wherein a third groove is formed at the edge of the substrate, and
wherein the second groove and the third groove are disposed to correspond to each other.

2. The thermoelectric module of claim 1, wherein the substrate comprises a first region and a second region, the thermoelectric element is disposed on the first region, and the connector part is disposed on the second region.

3. The thermoelectric module of claim 1, wherein the connector part comprises a first connector and a second connector symmetrically disposed to be spaced apart from each other.

4. The thermoelectric module of claim 3, wherein at least a part of the first connector and the second connector are disposed to perpendicularly overlap the first groove.

5. The thermoelectric module of claim 4, wherein an electric wire is connected to at least one of ends of the first connector and ends of the second connector that are disposed to perpendicularly overlap the first groove.

6. The thermoelectric module of claim 4, wherein the cover member comprises:
a first cover region disposed on the first connector; and
a second cover region disposed on the second connector, and wherein the first groove is disposed between the first cover region and the second cover region.

7. The thermoelectric module of claim 6, wherein the cover member further comprises a first guide region and a second guide region respectively protruding from the first cover region and the second cover region toward the substrate,
wherein the first guide region is disposed on a side surface of the first connector, and
wherein the second guide region is disposed on a side surface of the second connector.

8. The thermoelectric module of claim 7, wherein the first guide region and the second guide region are in contact with the substrate.

9. The thermoelectric module of claim 7, wherein the second groove includes a curved surface having a predetermined curvature.

10. The thermoelectric module of claim 7, further comprising a fluid flow part having one surface on which the substrate is disposed.

11. The thermoelectric module of claim 10, wherein a plurality of first through-holes are disposed to be spaced apart from each other at two sides of the cover member, and the fluid flow part, the substrate, and the cover member are coupled through the plurality of first through-holes.

12. The thermoelectric module of claim 11, wherein a width of each of the first cover region and the second cover region is 0.8 to 0.95 times a width of each of the first connector and the second connector.

13. The thermoelectric module of claim 11, wherein a width of each of the first cover region and the second cover region is larger than a width of each of the first connector and the second connector.

14. The thermoelectric module of claim 1, wherein the cover member includes an insulating material.

15. A power generation system comprising:
a power generation apparatus comprising a fluid flow part, and a thermoelectric module disposed on at least one surface of the fluid flow part; and
a chamber comprising an internal space in which the power generation apparatus is disposed, and a coupling part coupled to the power generation apparatus,
wherein the thermoelectric module comprises:
a substrate;
a thermoelectric element disposed on the substrate; and
a cover member disposed on the substrate and disposed at one side of the thermoelectric element,
wherein the cover member comprises a first side surface closest to one side of the thermoelectric element, and a second side surface opposite to the first side surface,
wherein the first side surface comprises a first groove concave toward the second side surface,
wherein the second side surface is disposed along an edge of the substrate and comprises a second groove concave toward the first side surface,
wherein a width of the first groove is larger than a width of the second groove,
wherein a third groove is formed at the edge of the substrate,
wherein the second groove and the third groove are disposed to correspond to each other, and
wherein the coupling part comprises a first recess disposed in an outer surface facing the internal space.

16. The power generation system of claim 15, comprising a first welding bead disposed in the first recess.

17. The power generation system of claim 16, wherein the first recess has an inclination in a direction from an outer surface to an inner surface of the coupling part.

* * * * *